(12) United States Patent
Muraoka et al.

(10) Patent No.: US 10,818,626 B2
(45) Date of Patent: Oct. 27, 2020

(54) CONNECTION WIRING

(71) Applicant: SHARP KABUSHIKI KAISHA, Sakai, Osaka (JP)

(72) Inventors: Seiji Muraoka, Sakai (JP); Yukio Shimizu, Sakai (JP); Motoji Shiota, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/465,842

(22) PCT Filed: Nov. 24, 2017

(86) PCT No.: PCT/JP2017/042167
§ 371 (c)(1),
(2) Date: May 31, 2019

(87) PCT Pub. No.: WO2018/101159
PCT Pub. Date: Jun. 7, 2018

(65) Prior Publication Data
US 2019/0295974 A1 Sep. 26, 2019

(30) Foreign Application Priority Data
Dec. 1, 2016 (JP) ................................. 2016-234045

(51) Int. Cl.
H01L 29/04 (2006.01)
H01L 23/00 (2006.01)
G02F 1/1345 (2006.01)
G09F 9/30 (2006.01)
G09F 9/00 (2006.01)

(52) U.S. Cl.
CPC ............ *H01L 24/06* (2013.01); *G02F 1/1345* (2013.01); *G02F 1/13458* (2013.01); *G09F 9/00* (2013.01); *G09F 9/30* (2013.01); *H01L 24/11* (2013.01); *H01L 2224/06* (2013.01); *H01L 2224/32145* (2013.01); *H01L 2224/48227* (2013.01); *H01L 2224/48465* (2013.01); *H01L 2224/73203* (2013.01)

(58) Field of Classification Search
CPC ........... H01L 24/06; H01L 2224/73204; H01L 24/83; H01L 224/73265
See application file for complete search history.

(56) References Cited

U.S. PATENT DOCUMENTS

2019/0221536 A1* 7/2019 Umemoto ............... H01L 24/17

FOREIGN PATENT DOCUMENTS

WO 2013/128857 A1 9/2013

* cited by examiner

Primary Examiner — Samuel A Gebremariam
(74) Attorney, Agent, or Firm — ScienBiziP, P.C.

(57) ABSTRACT

Provided is connection wiring capable of inhibiting connection defects between bumps and pads at the time of semiconductor chip mounting and also allowing an increase in the number of pads. In an area between a pad row in any stage and a pad row in an adjacent stage, a first line 31 is disposed so as to pass under an adjacent second line 32, or a second line 32 is disposed so as to pass over an adjacent first line 31. In this case, three lines are disposed in any area between pads 20 in each stage such that the three lines include a first line 31 situated in the middle, and second lines 32 are situated so as to have the first line 31 positioned therebetween. Thus, the pitch between the pads 20 can be further reduced without reducing the width of the pads 20.

8 Claims, 16 Drawing Sheets (A) CROSS SECTION B-B (B) CROSS SECTION C-C (A) CROSS SECTION D-D (B) CROSS SECTION E-E (A)
CROSS SECTION F-F (B)
CROSS SECTION G-G (C)
CROSS SECTION H-H (A)

(B)

(C)

CONNECTION WIRING

TECHNICAL FIELD

The present invention relates to connection wiring, particularly to connection wiring for connecting a drive IC (integral chip) and a display device.

BACKGROUND ART

It is often the case that in a liquid crystal display device, an IC chip that is a non-packaged chip called a bare chip and functions as a driver circuit (hereinafter referred to as a "drive chip" or a "semiconductor chip"), is mounted directly on a liquid crystal glass panel by COG (chip-on-glass) mounting technology. In this case, the drive chip, which has connection electrodes in the form of protrusions called bumps, is connected at output terminals to connection wiring pads after placing the drive chip such that the output terminals face the connection wiring pads and are aligned therewith. This allows control signals and signal voltages generated by the drive chip to be provided to pixel circuits connected to lines respectively extending from the pads, so that the liquid crystal panel displays an image.

Recent years have seen a rapid advancement in high-resolution images, and correspondingly, the number of bumps formed per drive chip has sharply increased. Accordingly, to deal with such an increased number of bumps per drive chip, the connection wiring pads are disposed in a staggered arrangement. For example, Patent Document 1 discloses a liquid crystal panel with connection wiring pads disposed on a substrate in a three-stage staggered arrangement.

CITATION LIST

Patent Document

Patent Document 1: International Publication WO 2013/128857

SUMMARY OF THE INVENTION

Problems to be Solved by the Invention

In the case where it is not possible to deal with an increased number of bumps per drive IC even by disposing pads in a three-stage staggered arrangement, as in Patent Document 1, it is conceivable to decrease the width of each pad and pad pitch and dispose more pads on a glass substrate. However, decreasing the pad width results in a smaller margin for aligning the pads with the bumps, and therefore, connection defects might be more likely to occur due to misalignment when the bumps and the pads are connected.

Furthermore, when electrically connecting the pads and the bumps, anisotropic conductive films (ACF), which are thermoset films with conductive microparticles (hereinafter referred to as "conductive particles") dispersed therein, are placed between the pads and the bumps and heated while applying pressure to the pads and the bumps. As a result, the bumps and the pads are electrically connected via the conductive particles. However, in the case where the pad width is decreased, when the same AFC as conventional is used, a smaller number of conductive particles are positioned between the pads and the bumps, which might cause connection defects.

Therefore, an objective of the present invention is to provide connection wiring capable of inhibiting connection defects between bumps and pads at the time of semiconductor chip mounting and also allowing an increase in the number of pads.

Solution to the Problems

A first aspect of the present invention is directed to a connection wiring including:

a plurality of pads disposed in a multi-stage staggered arrangement with four or more stages; and a plurality of lines respectively extending from the pads, wherein, the pads include first pad layers formed on a substrate and second pad layers stacked on top of the first pad layers and smaller than the first pad layers, the lines include first lines formed in the same tier as the first pad layers and extending from the first pad layers and second lines formed in the same tier as the second pad layers and extending from the second pad layers, in an area between the pads arranged in the same stage, at least one of the first lines and at least two of the second lines are disposed parallel to one another such that two of the second lines are situated on opposite sides of one of the first lines so as to have the first line positioned therebetween, and in an intersecting area between pad rows of adjacent stages, a first type of either the first or second lines crosses a second type of line adjacent to a first type above or below a second type so as to be positioned between a different pair of a second type of lines and extend toward an area between the pads in a pad row in a subsequent stage.

In a second aspect of the present invention, based on the first aspect of the present invention, wherein, in the intersecting area where the lines that extend from the pads in the pad row in are the second lines, the first line is formed so as to cross an adjacent second line below the adjacent second line from a point of being positioned between a pair of second lines to a point of being positioned between a different pair of second lines, and in the intersecting area where the lines that extend from the pads in the pad row are the first lines, the pair of the second lines with the first line positioned therebetween is disposed so as to respectively cross first lines adjacent to the pair of the second lines above the adjacent first lines and have a different first line positioned therebetween.

In a third aspect of the present invention, based on the second aspect of the present invention, wherein, the pads are disposed in a four-stage staggered arrangement, the lines that are disposed in the area between the pads in the same stage consist of one first line and two second lines disposed with the first line positioned therebetween, in the intersecting areas where the lines that extend from the pads in the pad row are the second lines, the first line is formed so as to cross an adjacent second line below the adjacent second line to a point of being positioned between a different pair of second lines, and in the intersecting area where the lines that extend from the pads in the pad row are the first lines, the pair of the second lines with the first line positioned therebetween is disposed so as to respectively cross first lines adjacent to the pair of the second lines above the adjacent first lines and have a different first line positioned therebetween.

In a fourth aspect of the present invention, based on the second aspect of the present invention, wherein, the pads are disposed in a six-stage staggered arrangement, the lines that are disposed in the area between the pads arranged in the same stage consist of two first lines and three second lines with the two first lines positioned between respective pairs from among the three second lines, in the intersecting area where the lines that extend from the pads in the pad row are the second lines, the two first lines are formed so as to respectively cross second lines adjacent to the two first lines below the adjacent second lines to a point of being respectively positioned between different pairs of second lines, and in the intersecting area where the lines that extend from the pads in the pad row are the first lines, the three second lines with the two first lines positioned between the respective pairs are disposed so as to respectively cross first lines adjacent to the three second lines above the adjacent first lines and make pairs in such a manner that each pair has a different first line positioned therebetween.

In a fifth aspect of the present invention, based on the third or fourth aspects of the present invention, wherein in the intersecting area where the lines that extend from the pads in the pad row are the second lines, the second lines are formed so as to become wider in an intersection where the second lines cross the first line above the first line.

A sixth aspect of the present invention is directed to a display device including:

a display portion having a plurality of data signal lines, a plurality of scanning signal lines crossing the data signal lines, and a plurality of pixel circuits respectively disposed near intersections of the data signal lines and the scanning signal lines;

a semiconductor chip with a driver circuit formed for driving the pixel circuits; and connection wiring of the first aspect of the connection wiring, wherein, the semiconductor chip is mounted on the connection wiring by a plurality of bumps formed on a surface of the semiconductor chip being bonded under pressure to the respective pads of the connection wiring by means of an anisotropic conductive film, and the pads of the connection wiring have lines extending therefrom and connected at a first end to the data signal lines or the scanning signal lines.

In a seventh aspect of the present invention, based on the sixth aspect of the present invention, wherein the lines that respectively extend from the pads of the connection wiring are connected at a second end to a test circuit.

In an eighth aspect of the present invention, based on the sixth aspect of the present invention, wherein the substrate with the first pad layers formed thereon is a transparent substrate.

Effect of the Invention

In the first aspect of the invention, the connection wiring includes the pads disposed in a multi-stage staggered arrangement with four or more stages, and in the area between the pads arranged in the same stage, at least one of the first lines and at least two of the second lines are disposed parallel to one another such that two of the second lines are situated on opposite sides of one of the first lines so as to have the first line positioned therebetween. In the intersecting area between pad rows of adjacent stages, a first type of either the first or second lines crosses a second type of line adjacent to the a first type above or below a second type so as to be positioned between a different pair of a second type of lines. Thus, pad pitch can be further reduced, with the result that the number of pads can be increased. In this case, pad width remains the same as conventional, and therefore, alignment margin required for connecting bumps of a semiconductor chip to the pads is the same as conventional. Thus, connection defects become less likely to occur between the bumps and the pads.

In the second aspect of the invention, in the intersecting area where the lines that extend from the pads in the pad row are the second lines, the first line is formed so as to cross an adjacent second line below the adjacent second line from a point of being positioned between a pair of second lines to a point of being positioned between a different pair of second lines, and in the intersecting area where the lines that extend from the pads in the pad row are the first lines, the pair of the second lines with the first line positioned therebetween is disposed so as to respectively cross first lines adjacent to the pair of the second lines above the adjacent first lines and have a different first line positioned therebetween. Thus, in any intersecting areas, pad pitch can be further reduced, with the result that the number of pads can be increased. In this case, pad width remains the same as conventional, and therefore, alignment margin required for connecting bumps of a semiconductor chip to the pads is the same as conventional. Thus, connection defects become less likely to occur between the bumps and the pads.

In the third aspect of the invention, the connection wiring with the pads disposed in a four-stage staggered arrangement renders it possible to increase the number of pads and suffer from fewer connection defects between bumps of a semiconductor chip and the pads.

In the fourth aspect of the invention, the connection wiring with the pads disposed in a six-stage staggered arrangement renders it possible to increase the number of pads and suffer from fewer connection defects between bumps of a semiconductor chip and the pads.

In the fifth aspect of the invention, the second lines are formed so as to become wider in the intersection where the second lines pass the first line over the first line, whereby it is rendered possible to prevent the second line from being constricted or broken due to some level difference caused by the first line.

In the sixth aspect of the invention, the bumps formed on a semiconductor chip for driving a display device are connected to the pads of the connection wiring in the first aspect. Thus, even when the number of bumps per semiconductor chip is increased, the bumps can be connected to the respective pads without causing connection defects.

In the seventh aspect of the invention, the lines of the connection wiring are connected at a second end to a test circuit, whereby it is rendered possible to confirm whether the display device can operate normally.

In the eighth aspect of the invention, the connection wiring is formed on a transparent substrate, and therefore, when the pad is viewed through the transparent substrate under a microscope, only the first pad layer can be seen. As a result, indentations in the first pad layer caused by conductive particles in an ACF being pressed is readily visible, and therefore, the number of indentations can be readily counted. Thus, by the number of indentations counted, the determination as to whether connection quality is good or poor can be readily made.

MODES FOR CARRYING OUT THE INVENTION

1. Basic Study

Before describing embodiments of the present invention, the basic study preliminarily conducted by the present inventors in order to clarify problems with connection wiring with pads for connecting with drive chip bumps will be described.

Figure 1:
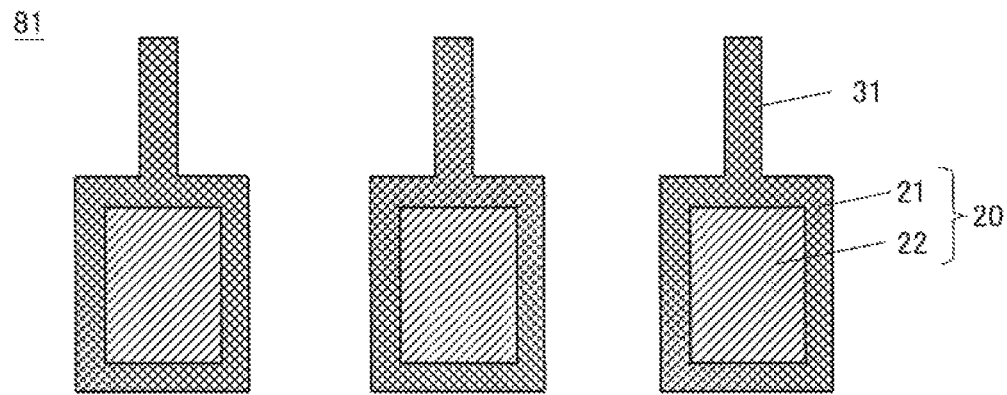
FIG. 1 is a diagram illustrating connection wiring, as used in basic study, including pads arranged in a row and first lines extending from the pads.
Figure 2:
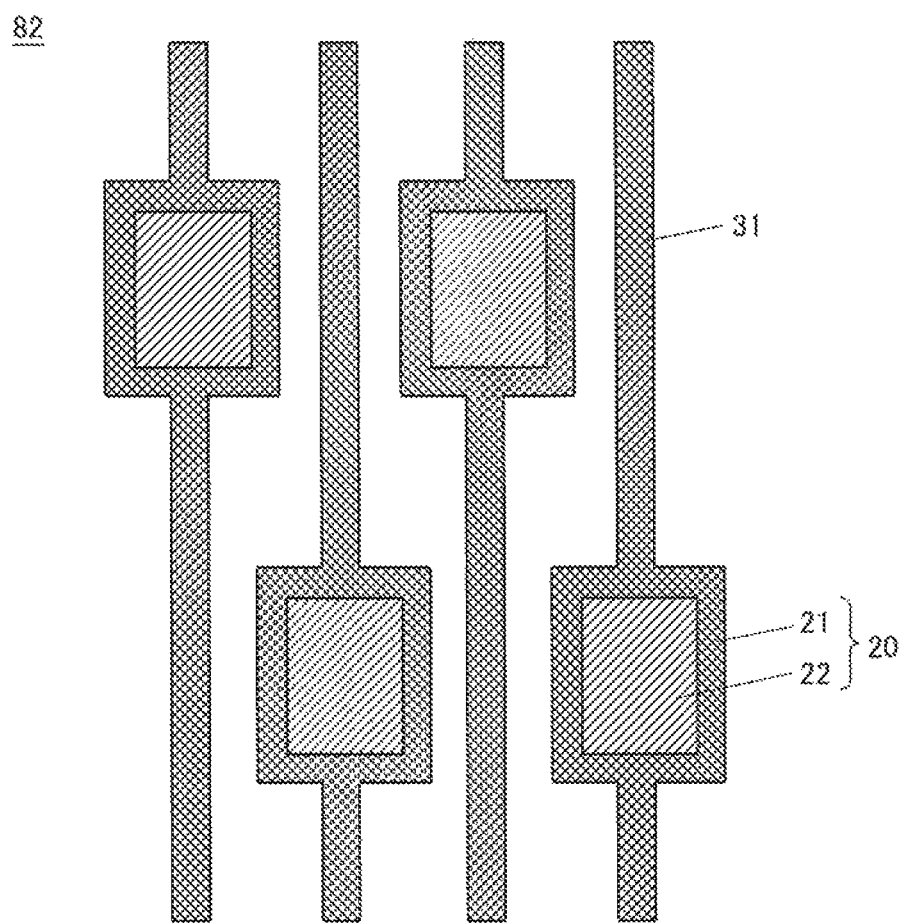
FIG. 2 is a diagram illustrating connection wiring, as used in the basic study, including pads disposed in a two-stage staggered arrangement and first lines extending from the pads.
Figure 3:
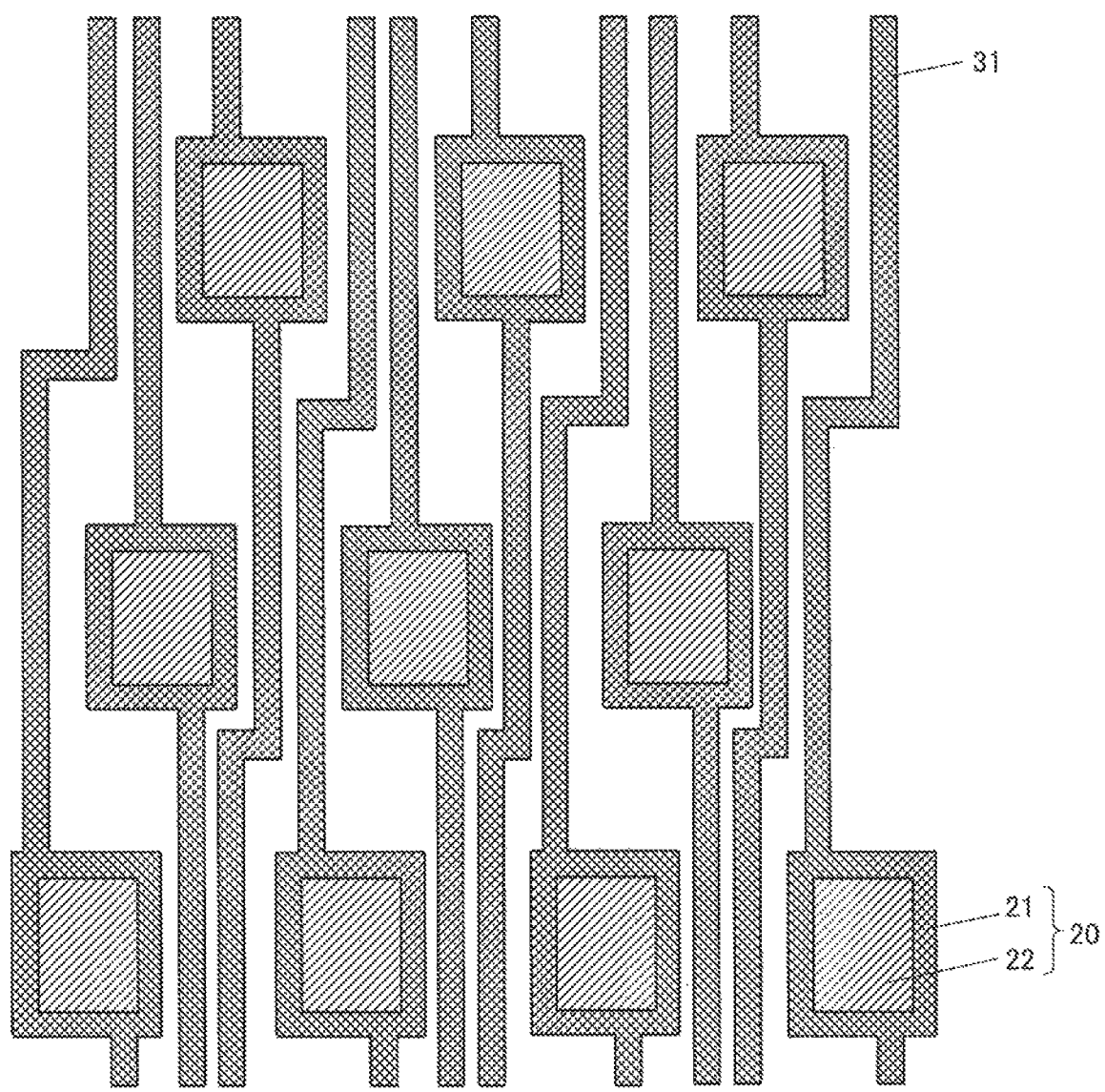
FIG. 3 is a diagram illustrating connection wiring, as used in the basic study, including pads disposed in a three-stage staggered arrangement and first lines extending from the pads.

FIG. 1 is a diagram illustrating connection wiring 81 including pads 20 disposed in a row and first lines 31 extending from the pads 20. FIG. 2 is a diagram illustrating connection wiring 82 including pads 20 disposed in a two-stage staggered arrangement and first lines 31 extending from the pads 20. FIG. 3 is a diagram illustrating connection wiring 83 including pads 20 disposed in a three-stage staggered arrangement and first lines 31 extending from the pads 20. All the pads 20 shown in FIGS. 1 to 3 include rectangular first pad layers 21, which are layers of a first-tier metal (referred to below as a "first metal"), and rectangular second pad layers 22, which are layers of a second-tier metal (referred to below as a "second metal"). The first pad layer 21 is larger than the second pad layer 22, and the first and second pad layers 21 and 22 are electrically connected through a contact hole provided in an insulating film. Moreover, all the first lines 31 of the connection wiring 81 to 83 are made of the first metal.

The connection wiring 81 shown in FIG. 1 includes the pads 20 arranged in a row, and all the first lines 31 extending from the pads 20 are connected to the first pad layers 21. The connection wiring 82 shown in FIG. 2 includes the pads 20 disposed in a two-stage staggered arrangement. The first lines 31 that are connected to the pads 20 in the first stage are disposed in the same manner as shown in FIG. 1. However, the first lines 31 that are connected to the pads 20 in the second stage are disposed so as to respectively pass through closest areas between the pads 20 in the first stage. The connection wiring 83 shown in FIG. 3 includes the pads 20 disposed in a three-stage staggered arrangement. The first lines 31 that are connected to the pads 20 in the first stage are disposed in the same manner as shown in FIG. 1, and the first lines 31 that are connected to the pads 20 in the second stage are disposed in the same manner as shown in FIG. 2. The first lines 31 that are connected to the pads 20 in the third stage are disposed so as to respectively pass through closest areas between the pads 20 in the second stage and also between the pads 20 in the first stage.

If the number of bumps per drive chip mounted on a liquid crystal panel substrate further increases, it becomes necessary to dispose the pads 20 in a four-stage staggered arrangement. In the case of the four-stage staggered arrangement, it is conceivable to form lines using either one or two types of metals. Moreover, in the case where two types of metals are used, it is further conceivable to dispose the two types of metals in two different arrangements. These arrangements will be described sequentially.

Figure 4:
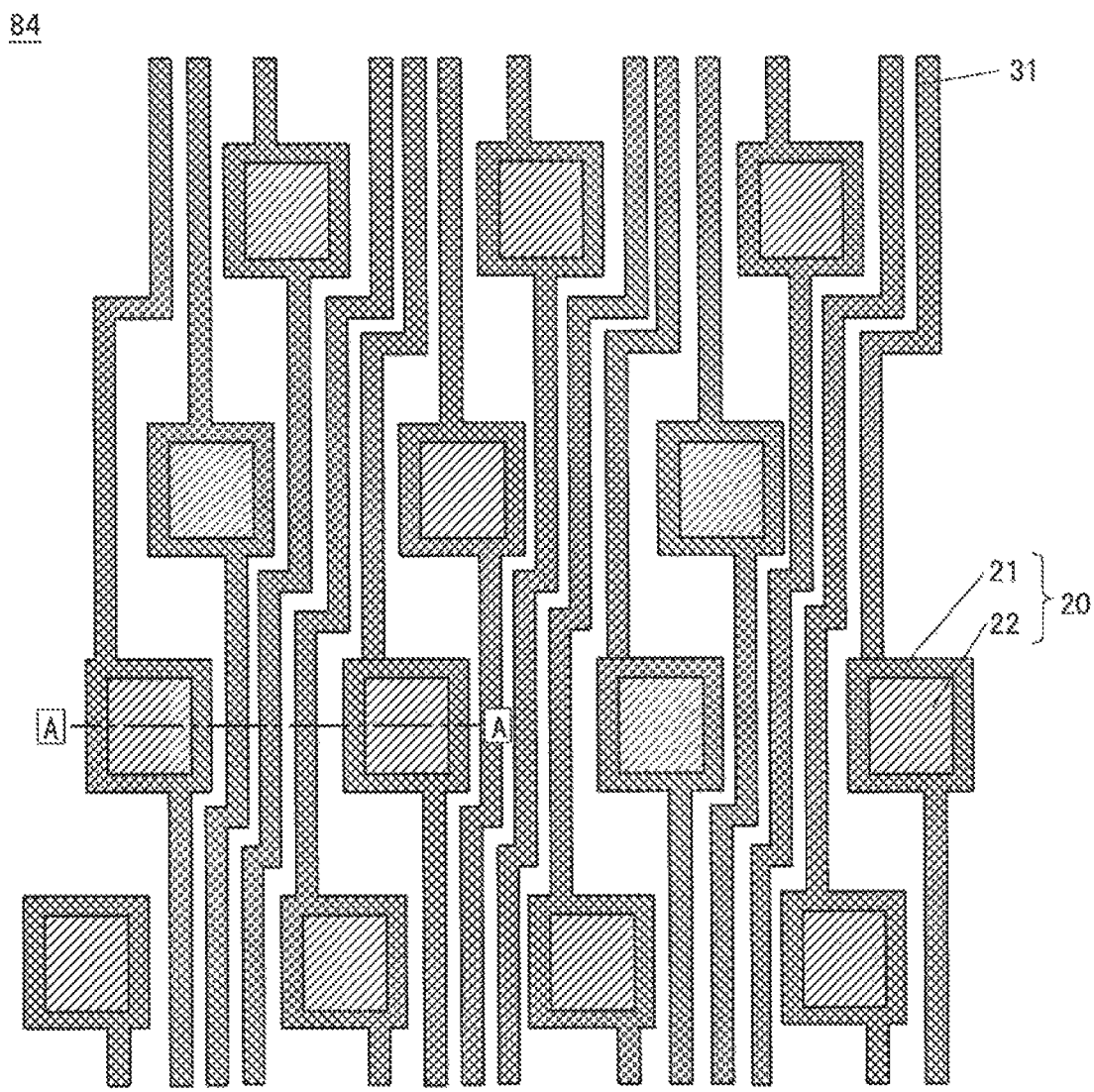
FIG. 4 is a plan view illustrating connection wiring, as used in the basic study, including pads and first lines formed of one type of metal.
Figure 5:
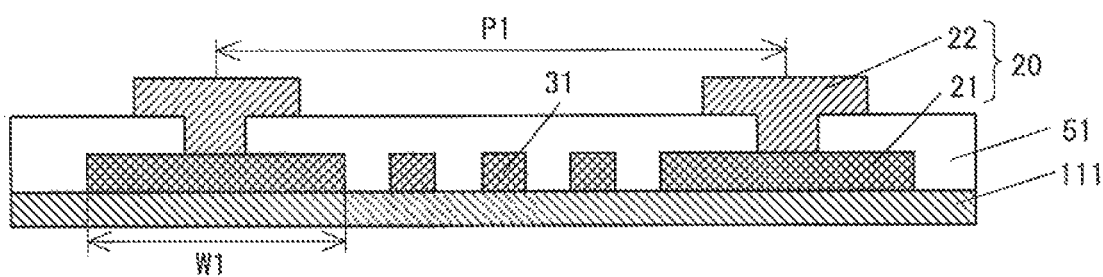
FIG. 5 is a cross-sectional view of the connection wiring shown in FIG. 4, taken along line A-A.

FIG. 4 is a plan view of connection wiring 84 including pads 20 and first lines 31 formed of one type of metal, and FIG. 5 is a cross-sectional view of the connection wiring 84 shown in FIG. 4, taken along line A-A. In the case where the pads 20 are arranged in four stages, three first lines 31 are disposed in each area between the pads 20 in each stage, as shown in FIGS. 4 and 5. In the case where the width of the pad 20 is W1 and the pitch between the pads 20 is P1, the pitch P1 between the pads 20 is wider than pitches in other arrangements to be described later. To decrease the pitch P1 between the pads 20, it is conceivable to reduce the width of each pad 20. However, reducing the width of the pad 20 results in a smaller margin for aligning the pads 20 with bumps, with the result that connection defects become more likely to occur. Accordingly, it is difficult to decrease the pitch P1 between the pads 20 by reducing the width of the pad 20.

Figure 6:
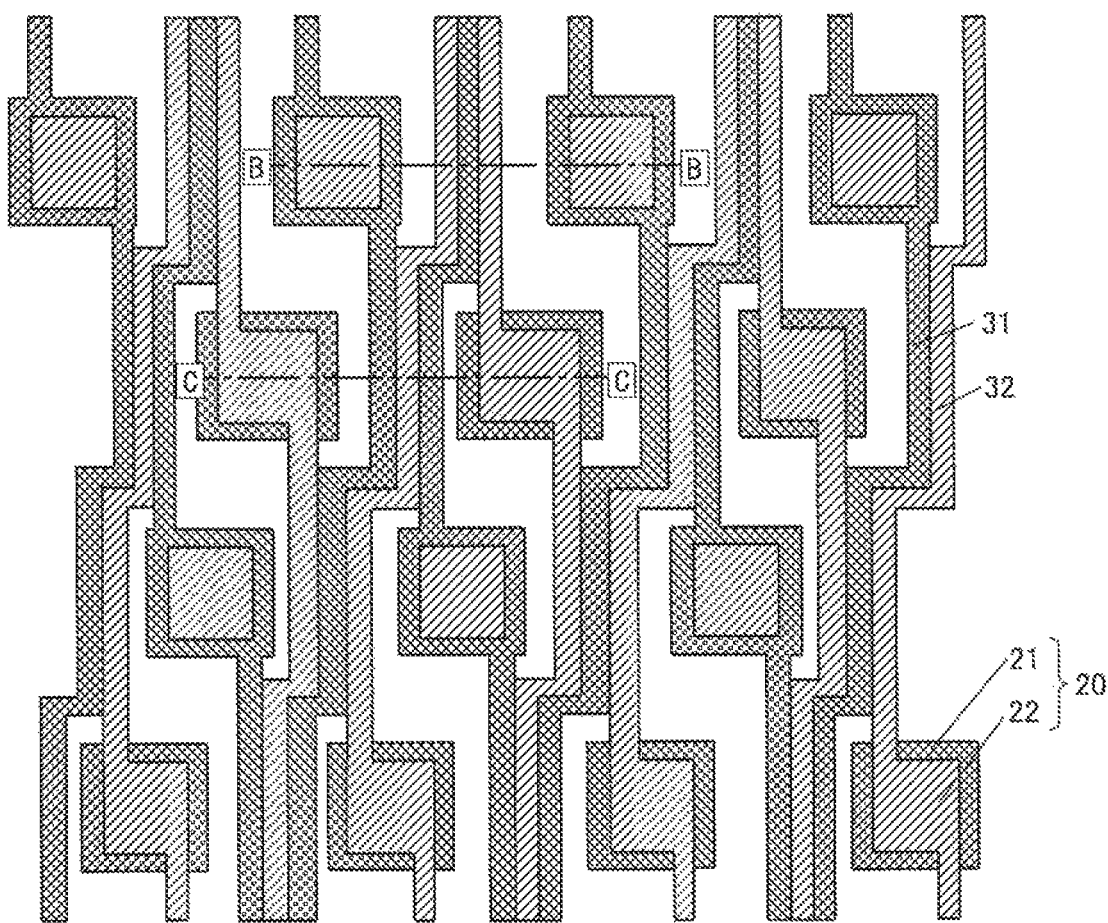
FIG. 6 is a plan view illustrating connection wiring, as used in the basic study, including pads and first and second lines formed of two types of metals.
Figure 7:
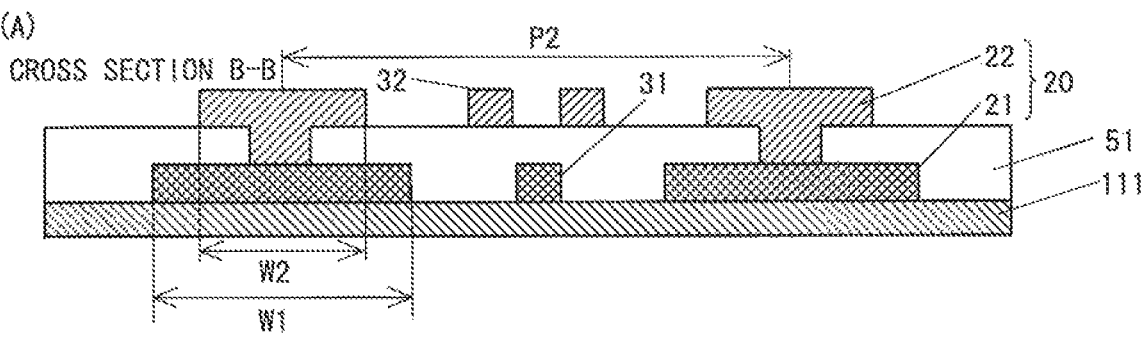
FIG. 7 provides cross-sectional views of the connection wiring shown in FIG. 6; more specifically, part (A) is a cross-sectional view of the connection wiring shown in FIG. 6, taken along line B-B, and part (B) is a cross-sectional view of the connection wiring shown in FIG. 6, taken along line C-C.
Figure 7:
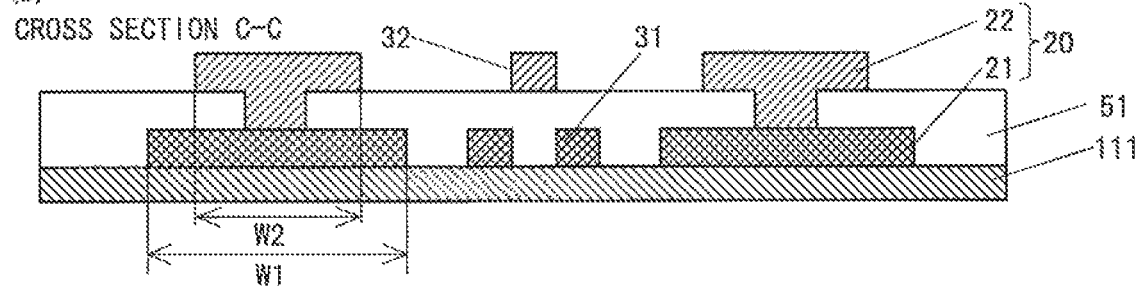

FIG. 6 is a plan view illustrating connection wiring 85 including pads 20 and first and second lines 31 and 32 formed of two types of metals. FIG. 7 provides cross-sectional views of the connection wiring 85 shown in FIG. 6; more specifically, FIG. 7(A) is a cross-sectional view of the connection wiring 85 shown in FIG. 6, taken along line B-B, and FIG. 7(B) is a cross-sectional view of the connection wiring 85 shown in FIG. 6, taken along line C-C.

As shown in FIG. 6, in the connection wiring 85, the lines that extend from the pads 20 in the first and third stages are the first lines 31, and the lines that extend from the pads 20 in the second and fourth stages are the second lines 32. In this case, of the three lines that are disposed in each area between the pads 20 in the first and third stages, the two outside lines are the second lines 32, which are made of the same second metal as the second pad layer 22, as shown in FIG. 7(A). However, the second pad layer 22 has a width W2 less than the width W1 of the first pad layer 21, and therefore, even if the first pad layer 21 and the second line 32 are closely positioned so as to appear to be in contact with each other when viewed from above, the second pad layer 22 and the second line 32 can be sufficiently spaced apart so as not to contact each other. Accordingly, forming the wiring lines in two vertically separate layers renders it possible to decrease the pitch between the pads 20 from P1 to P2, while keeping the pad 20 with the same width W1 as in the case of the connection wiring 84 shown in FIG. 4.

On the other hand, as for the second and fourth stages, of the three lines that are disposed in each area between the pads 20, the two outside lines are the first lines 31, which are made of the same first metal as the first pad layer 21, as shown in FIG. 7(B). In this case, when the pads 20 are disposed with the pitch P2, the area between the first pad layers 21 is narrowed because the width W1 of the first pad layer 21 is larger than the width W2 of the second pad layer 22. In such an area, two first lines 31 can be disposed with sufficient space to keep the first lines 31 out of contact with the first pad layers 21, but not enough room is left so that the first pad layers 21 and the first lines 31 are more likely to contact each other.

Figure 8:
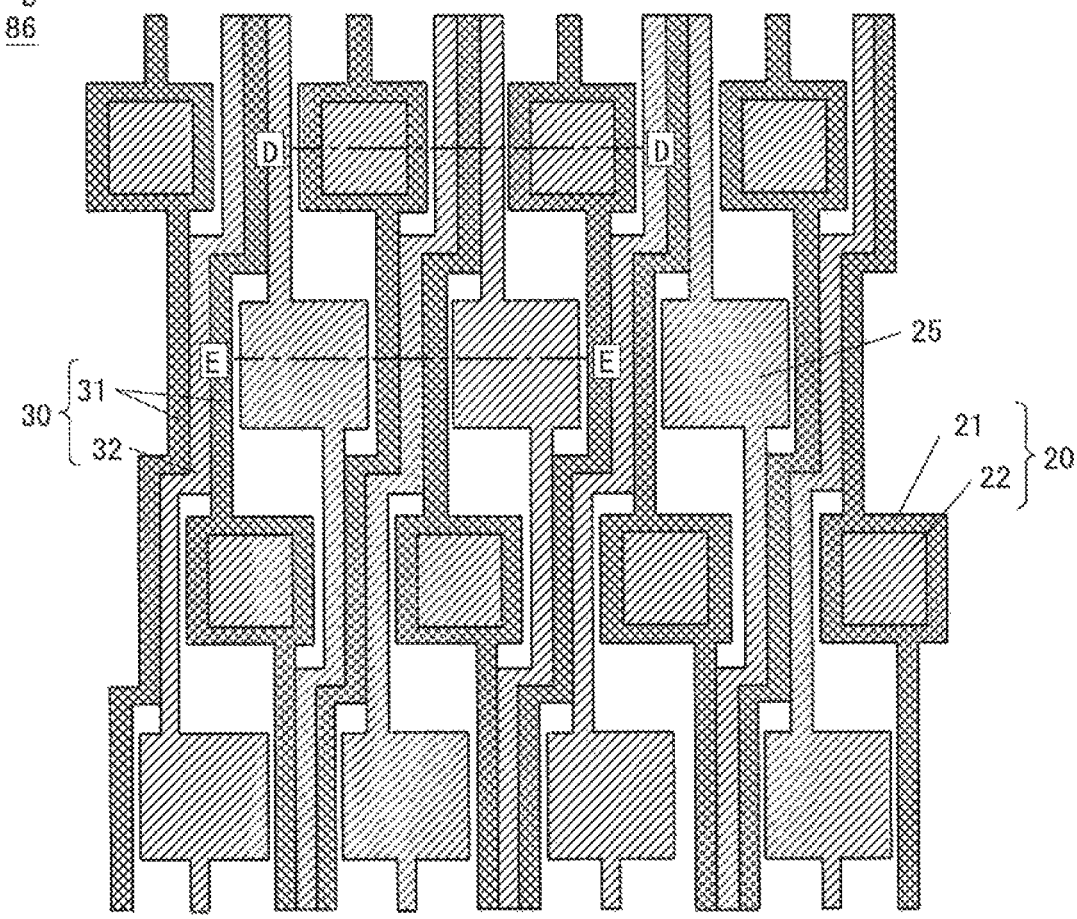
FIG. 8 is a plan view illustrating connection wiring, as used in the basic study, including pads and first and second lines formed of two types of metals.
Figure 9:
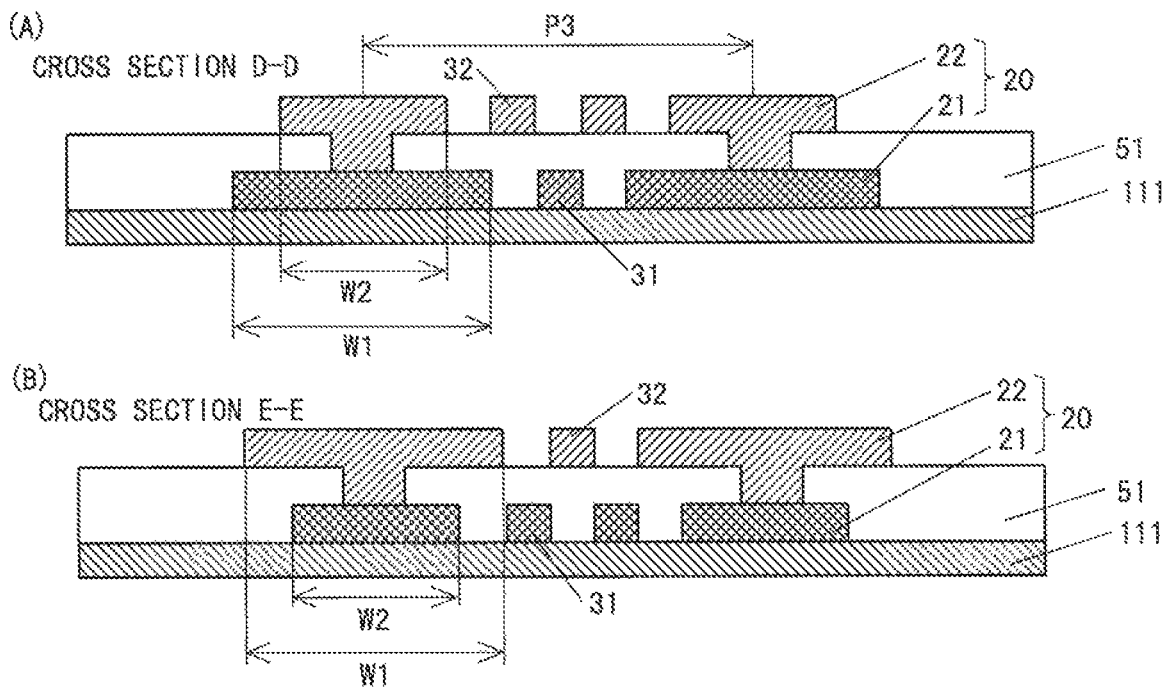
FIG. 9 provides cross-sectional views of the connection wiring shown in FIG. 8; more specifically, part (A) is a cross-sectional view of the connection wiring shown in FIG. 8, taken along line D-D, and part (B) is a cross-sectional view of the connection wiring shown in FIG. 8, taken along line E-E.

FIG. 8 is a plan view illustrating connection wiring 86 including pads 20 and first and second lines 31 and 32 formed of two types of metals, and FIG. 9 provides cross-sectional views of the connection wiring 86 shown in FIG. 8; more specifically, FIG. 9(A) is a cross-sectional view of the connection wiring 86 shown in FIG. 8, taken along line D-D, and FIG. 9(B) is a cross-sectional view of the connection wiring 86 shown in FIG. 8, taken along line E-E.

In the case of the connection wiring 85 shown in FIG. 6, it is difficult to narrow the spaces between the first pad layers 21 and the first lines 31 in the second and fourth stages, as mentioned earlier. Accordingly, in the connection wiring 86 shown in FIGS. 8 and 9, the pads 20 in the second and fourth stages can be formed such that the second pad layers 22 have the width W1 and the first pad layers 21 have the width W2 less than the width W1, which is the opposite to the case of the pads 20 formed in the first and third stages. In this case, of the three lines that are disposed in each area between the pads 20 in the second and fourth stages, the two outside lines are the first lines 31, and the middle line is the second line 32. Accordingly, both in the second and fourth stages also, the first pad layer 21 and the first line 31 can be sufficiently spaced apart so as not to contact each other. Therefore, the second pad layer 22 and the first line 31 can be closely positioned so as to appear to be in contact with each other when viewed from above.

On the other hand, as for the first and third stages, of the three lines that are disposed in the area between the pads 20, the two outside lines are the second lines 32, and the middle line is the first line 31. Therefore, in the first and third stages, the first pad layer 21 and the second line 32 can be closely positioned so as to appear to be in contact with each other when viewed from above, as in the case of the connection wiring 85 shown in FIG. 6.

Accordingly, the pitch P3 between the pads 20 can be set narrower than each of the aforementioned pitches P1 and P3 without changing the width W1 of the pad 20, and therefore, the number of pads 20 can be increased.

Figure 10:
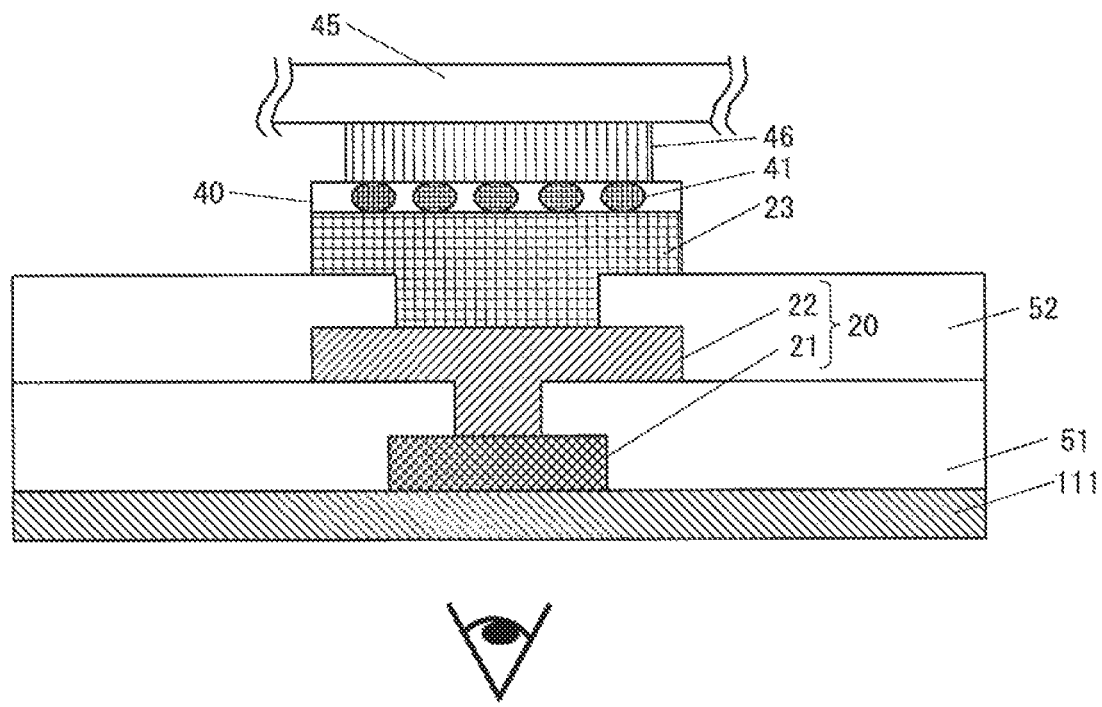
FIG. 10 is a cross-sectional view illustrating the state of connection between a bump of a drive chip and a pad of the connection wiring shown in FIG. 9.
Figure 11:
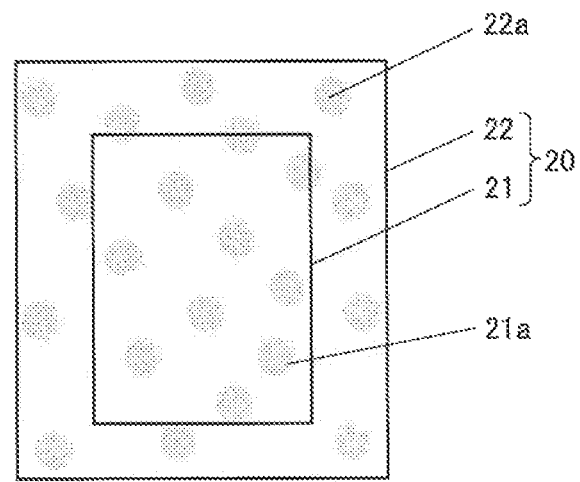
FIG. 11 is a plan view illustrating the state of connection between the bump and the pad shown in FIG. 10.

However, such an arrangement has a problem of having difficulty in determining whether the state of connection is good or poor. FIG. 10 is a cross-sectional view illustrating the state of connection between a bump 46 of a drive chip 45 and a pad 20 in a second stage, and FIG. 11 is a plan view illustrating the state of connection between the bump 46 and the pad 20 shown in FIG. 10. Provided between the bump 46 and the pad 20 is an ACF 40, which is an insulating film having a thickness of 15 to 70 µm and in which conductive particles 41, each being coated with a metal, such as nickel (Ni) or gold (Au), and having a diameter of 3 to 10 µm, are dispersed. The conductive particles 41 are dispersedly present in the ACF 40, and therefore, the entire ACF 40 is an insulator. However, by heating the bump 46 and the pad 20 with the ACF 40 positioned therebetween, while pressing, the conductive particles 41 allows the bump 46 and the pad 20 to be electrically connected therethrough.

In this case, when the number of conductive particles 41 between the bump 46 and the pad 20 is low, it is highly likely that conductive defects occur after shipment. Accordingly, the number of conductive particles 41 between the bump 46 and the pad 20 is counted, and when the number is lower than a predetermined number, the state of connection is determined to be "poor". An example of the method for counting the number of conductive particles 41 between the bump 46 and the pad 20 is counting the number of indentations in the pad 20 caused by slight distortions of approximately 10 nm when the conductive particles 41 are placed between the bump 46 and the pad 20.

In the pad 20 in the first stage of the connection wiring 86 shown in FIG. 8, the first pad layer 21 is larger than the second pad layer 22. Accordingly, when the pad 20 is viewed from a back surface side under a microscope, only the first pad layer can be seen. The determination as to whether the state of connection is good or poor can be made by the number of indentations in the first pad layer 21 caused by the conductive particles 41, and the state of connection between the bump 46 and the pad 20 is determined to be good when there are a number of indentations. In this case, the number of indentations in the first pad layer 21 can be readily counted, and therefore, the determination as to whether the state of connection is good or poor can be readily made.

However, as for the pad 20 in each of the second and fourth stages, the second pad layer 22 is larger than the first pad layer 21, as shown in FIG. 10, and therefore, when the pad 20 is viewed from the back surface side (the bottom side in FIG. 10) under a microscope, the first pad layer 21 and the second pad layer 22 are visible with the second pad layer 22 surrounding the first pad layer 21, as shown in FIG. 11. Moreover, these pad layers appear to have different tints, and therefore, indentations 22a in the second pad layer 22 are not readily visible, which makes it difficult to count the number of indentations 22a. Accordingly, the number of indentations counted decreases, which makes it difficult to manage the state of connection because the determination as to whether the state of connection between the pad 20 and the bump 46 has to be made only by the number of indentations 21a.

Therefore, on the basis of the results of the basic study, the present inventors conducted further studies and achieved the present invention. Embodiments carried out by the inventors will be described below.

2. First Embodiment

Figure 12:
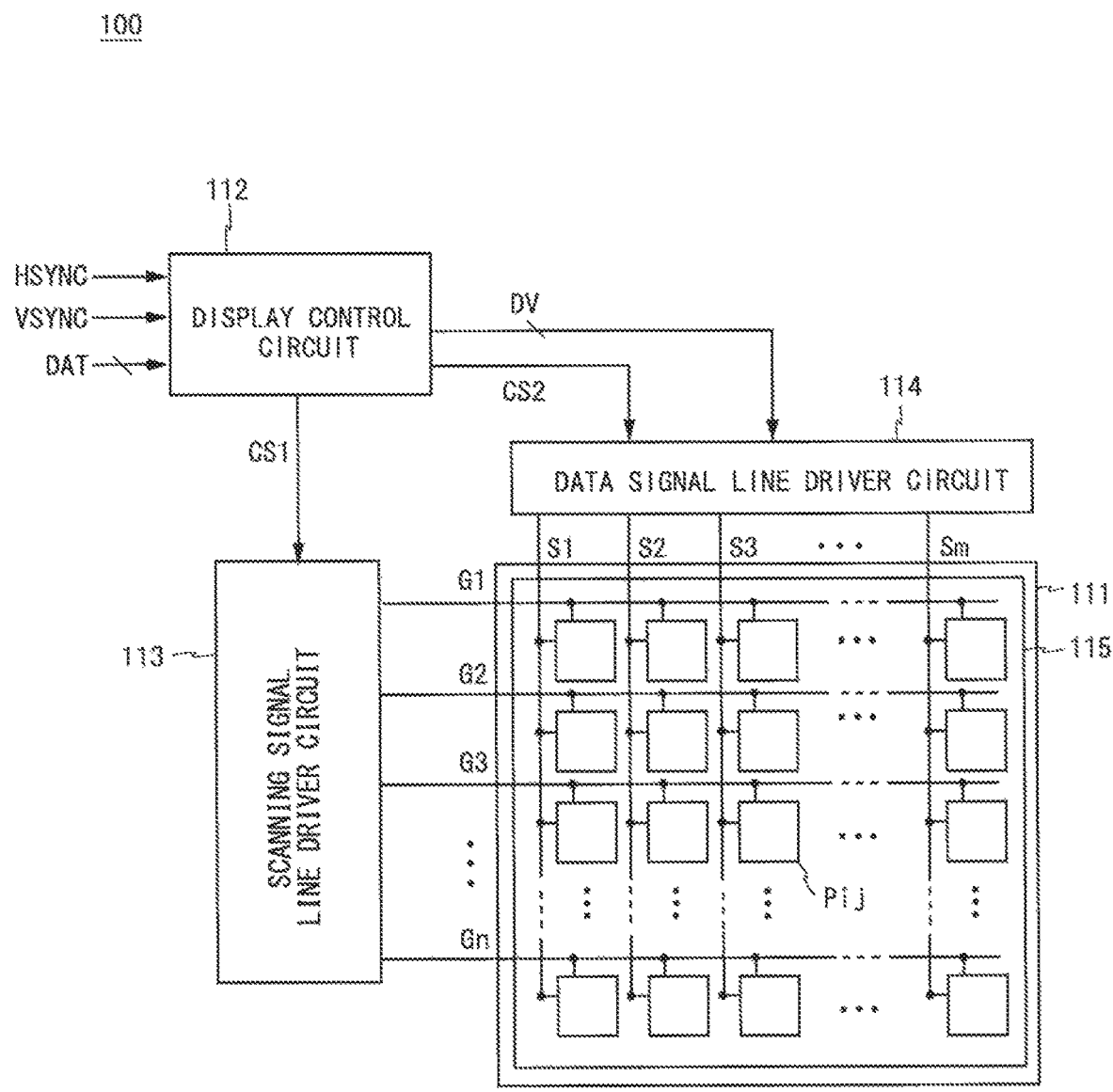
FIG. 12 is a block diagram illustrating the configuration of a liquid crystal display device with connection wiring according to a first embodiment of the present invention formed on a liquid crystal panel.

2.1 Configuration and General Operation of the Liquid Crystal Display Device FIG. 12 is a block diagram illustrating the configuration of a liquid crystal display device 100 with connection wiring 87 according to a first embodiment of the present invention formed on a liquid crystal panel 111. The liquid crystal display device 100 is an active-matrix display device including the liquid crystal panel 111, a display control circuit 112, a scanning signal line driver circuit 113, and a data signal line driver circuit 114, as shown in FIG. 12.

The liquid crystal panel 111 includes n scanning signal lines $G_1$ to $G_n$, m data signal lines $S_1$ to $S_m$, and (m×n) pixel circuits $P_{ij}$ (where m is an integer of 2 or more, and j is an integer of from 1 to m). The scanning signal lines $G_1$ to $G_n$ are disposed parallel to each other, and the data signal lines $S_1$ to $S_m$ are disposed parallel to each other so as to cross the scanning signal lines $G_1$ to $G_n$. The pixel circuit $P_{ij}$ is disposed near an intersection of the scanning signal line $G_i$ and the data signal line $S_j$. In this manner, the (m×n) pixel circuits $P_{ij}$ are disposed two-dimensionally, with each row consisting of m pixel circuits and each column consisting of n pixel circuits. The scanning signal line $G_i$ is connected in common to the pixel circuits $P_{ij}$ disposed in the i'th row, and the data signal line $S_j$ is connected in common to the pixel circuits $P_{ij}$ disposed in the j'th column.

The liquid crystal display device 100 is externally supplied with control signals, such as a horizontal synchronization signal HSYNC and a vertical synchronization signal VSYNC, and an image signal DAT. In accordance with these signals, the display control circuit 112 outputs a control signal CS1 to the scanning signal line driver circuit 113 and a control signal CS2 and digital image data DV to the data signal line driver circuit 114.

The scanning signal line driver circuit 113 provides high-level output signals sequentially to the scanning signal lines $G_1$ to $G_n$ one by one. As a result, the scanning signal lines $G_1$ to $G_n$ are sequentially selected one by one, thereby collectively selecting the pixel circuits $P_{ij}$ in one row at a time. In accordance with the control signal CS2 and the digital image data DV, the data signal line driver circuit 114 provides the data signal lines $S_1$ to $S_m$ with signal voltages corresponding to the digital image data DV. As a result, the signal voltages corresponding to the digital image data DV are written in the selected pixel circuits $P_{ij}$ in one row. Consequently, the liquid crystal display device 100 displays an image on a display portion 115 of the liquid crystal panel 111.

It should be noted that in the liquid crystal display device 100, a drive chip, which is a non-packaged IC chip called a bare chip, is used as a driver circuit including the scanning signal line driver circuit 113 and the data signal line driver circuit 114. The drive chip has bumps 46 made of gold (Au) and formed as output terminals. Accordingly, in the liquid crystal display device 100, the bumps of the drive chip are connected to pads 20 of the connection wiring 87 formed on the liquid crystal panel 111, by heating under pressure. This allows the control signals CS1 and the signal voltages generated by the drive chip to be applied respectively to the scanning signal lines $G_1$ to $G_n$ and the data signal lines $S_1$ to $S_m$.

2.2 Configuration of the Connection Wiring

Figure 13:
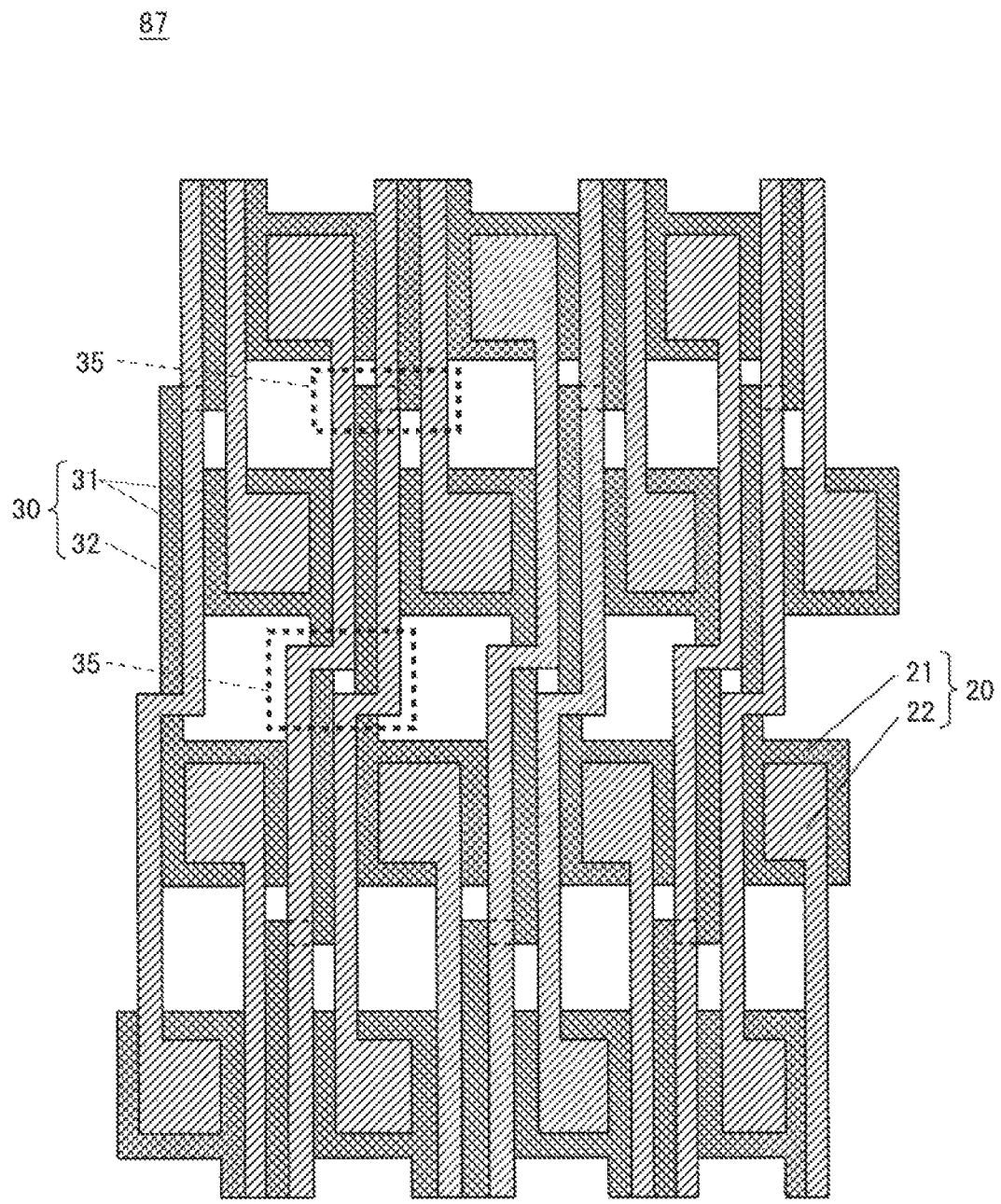
FIG. 13 is a plan view illustrating a part of the connection wiring according to the first embodiment, including pads disposed in a four-stage staggered arrangement, along with lines.
Figure 14:
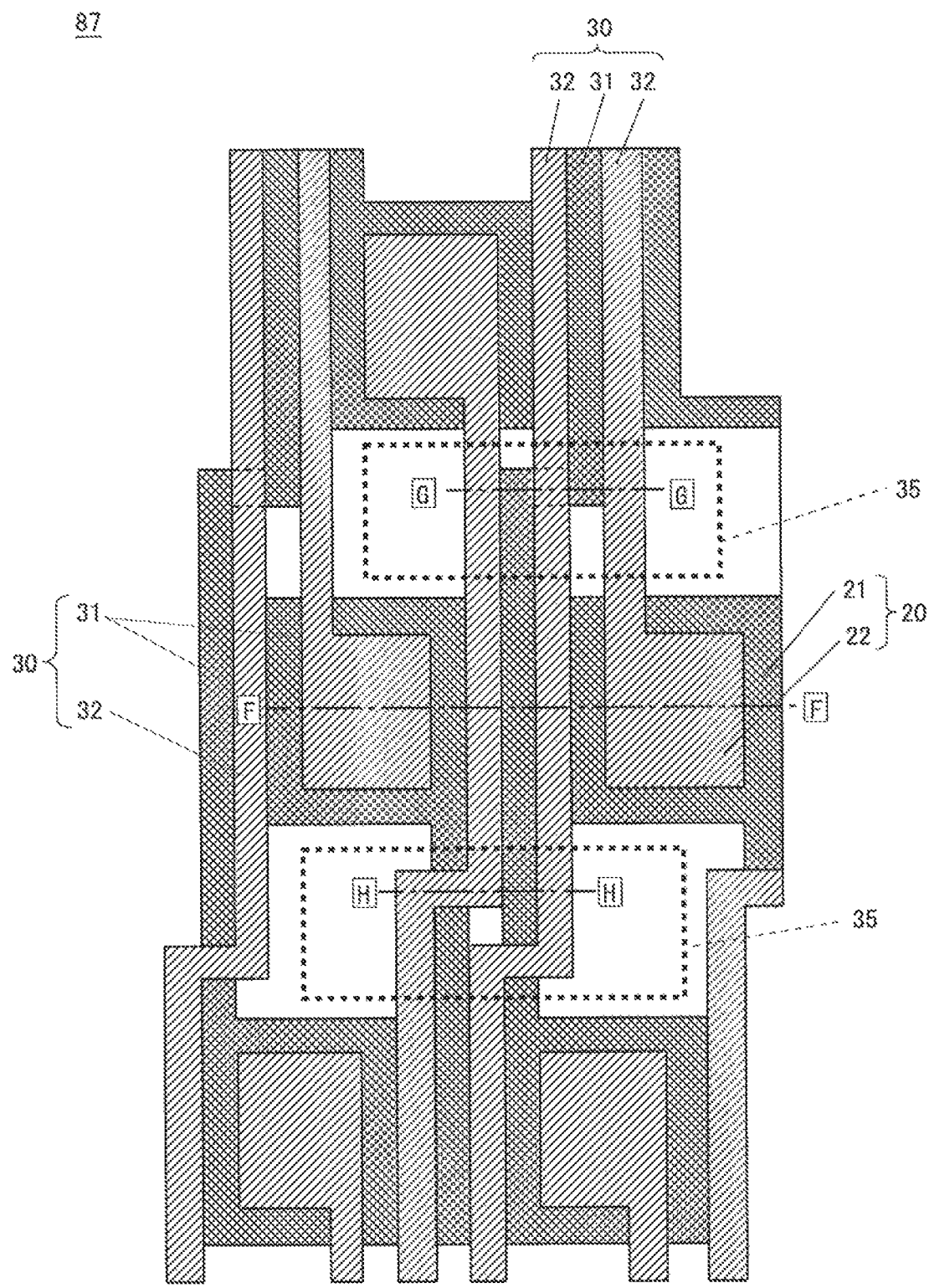
FIG. 14 is a plan view showing in enlargement a part of the connection wiring shown in FIG. 13.

FIG. 13 is a plan view illustrating a part of the connection wiring 87 according to the present embodiment, including the pads 20 disposed in a four-stage staggered arrangement, along with the lines 30, and FIG. 14 is a plan view showing in enlargement a part of the connection wiring 87 shown in FIG. 13. The lines 30 that extend to the top of FIG. 14 are connected to the scanning signal lines $G_1$ to $G_n$ or the data signal lines $S_1$ to $S_m$ formed on the liquid crystal panel 111, whereby control signals and signal voltages provided to the pads 20 via the bumps of the drive chip are respectively applied to the scanning signal lines $G_1$ to $G_n$ and the data signal lines $S_1$ to $S_m$. On the other hand, the lines 30 that extend to the bottom of FIG. 14 are connected to a test circuit (not shown) for testing the operation of the pixel circuits $P_{ij}$, whereby test control signals and test signal voltages provided by the test circuit are respectively applied to the scanning signal lines $G_1$ to $G_n$ and the data signal lines $S_1$ to $S_m$. Note that the connection wiring 87 shown in FIG. 13 is a part of the connection wiring formed on the liquid crystal panel 111, and, in actuality, extends leftward and rightward beyond FIG. 13.

Figure 15:
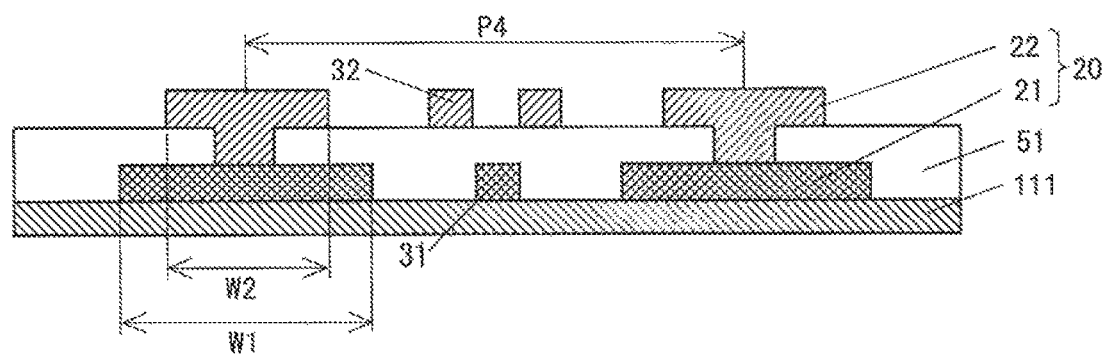
FIG. 15 provides cross-sectional views illustrating in cross section the connection wiring shown in FIG. 14; more specifically, part (A) is a cross-sectional view of pads of the connection wiring shown in FIG. 14, taken along line F-F, part (B) is a cross-sectional view of an intersecting area of the connection wiring shown in FIG. 14, taken along line G-G, and part (C) is a cross-sectional view of another intersecting area of the connection wiring shown in FIG. 14, taken along line H-H.
Figure 15:
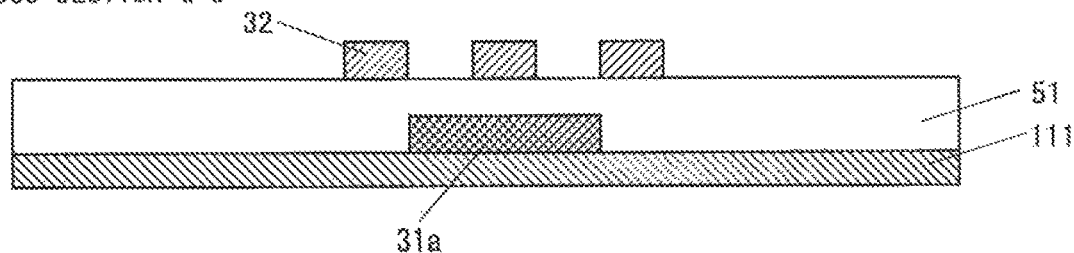
Figure 15:
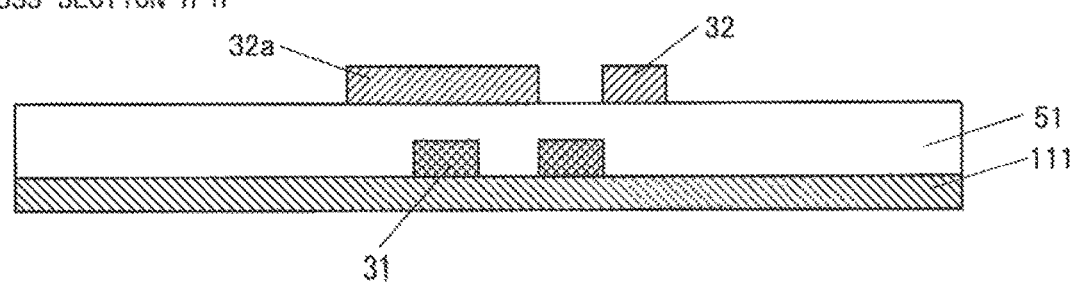

FIG. 15 provides cross-sectional views illustrating in cross section the connection wiring 87 shown in FIG. 14; more specifically, FIG. 15(A) is a cross-sectional view of pads 20 of the connection wiring 87 shown in FIG. 14, taken along line F-F, FIG. 15(B) is a cross-sectional view of an intersecting area 35 of the connection wiring 87 shown in FIG. 14, taken along line G-G, and FIG. 15(C) is a cross-sectional view of another intersecting area 35 of the connection wiring 87 shown in FIG. 14, taken along line H-H.

As shown in FIGS. 13 and 14, the pads 20 are disposed in a four-stage staggered arrangement, and the pads 20 in each stage are made up of stacks of first pad layers 21, second pad layers 22, and transparent electrodes (not shown), with the first pad layers 21 being formed larger than the second pad layers 22. Moreover, there are a total of three lines in each area between the pads 20 in each stage, the three lines consisting of one first line 31 made of the first metal and two second lines 32 made of the second metal.

Since the width W1 of the first pad layer 21 is larger than the width W2 of the second pad layer 22, the area between the first pad layers 21 is narrower than the area between the second pad layers 22. Accordingly, of the three lines that are disposed in the area between the pads 20, the first line 31 is formed of the first metal and hence disposed in the same tier as the first pad layer 21, and the two second lines 32 are formed of the second metal and hence disposed in the same tier as the second pad layer 22. Thus, even when the space between the first pad layer 21 and the first line 31 and the space between the second pad layer 22 and the second line 32 are narrowed by the same amount, the first pad layer 21 and the first line 31 become less likely to suffer from a short circuit caused by contacting each other, and the second pad layer 22 and the second line 32 also become less likely to suffer from a short circuit caused by contacting each other.

Therefore, these three lines are disposed such the first line 31 is situated between the two second lines 32 when viewed from above. In this case, in the area between the pads 20 in each stage, the first line 31 and the second lines 32 are disposed as will be described below.

As shown in FIGS. 14 and 15(A), in each area between the pads 20 in the first- and third-stages of the connection wiring 87, the first line 31 and the second lines 32 are disposed in the same manner as in the first and third stages shown in FIG. 9(A). Moreover, as for the second and fourth stages of the connection wiring 87, similarly, the first line 31 and the second lines 32 in the area between the pads 20 are disposed in the same manner as in the first stage.

Therefore, by providing a first line 31a so as to extend laterally in each intersecting area 35 between pad rows of the first and second stages, as shown in FIGS. 13 and 15(B), the first line 31 disposed in the middle of the area between the pads 20 in the first stage continues leftward so as to pass under the second line 32 adjacently positioned to the left. As a result, in the second stage, as in the first stage, the first line 31, when viewed from above, is situated between the second lines 32 in the area between the pads 20.

Furthermore, to dispose the first line 31 and the second lines 32 in each area between the pads 20 in the fourth stage in the same manner as in the third stage, second lines 32a are provided so as to extend laterally in each intersecting area 35 between pad rows of the second and third stages, as shown in FIGS. 13 and 15(C), whereby two second lines 32 continue leftward to respectively pass over the first lines 31 that are adjacently positioned to the left. As a result, in the fourth stage, as in the third stage, the first line 31, when viewed from above, is situated between the second lines 32 in the area between the pads 20.

In this manner, the first line 31 is disposed between the second lines 32 in each area between the pads 20 in each stage, with the result that, when viewed from above, two second lines 32 appear to be formed so as to sandwich one first line 31, and the first pad layers 21 in the pads appear to be in contact with the second lines.

Therefore, unlike in the case shown in FIG. 8, the pads 20 can be disposed with a narrower pitch P4 in all stages without changing the width W1 thereof. Thus, to deal with higher resolution, if the bump pitch for the drive chip is reduced and the number of bumps per drive chip is increased, the bumps 46 and the pads 20 can be connected by reducing the pitch between the pads 20 without changing the width of the pads 20.

Figure 16:
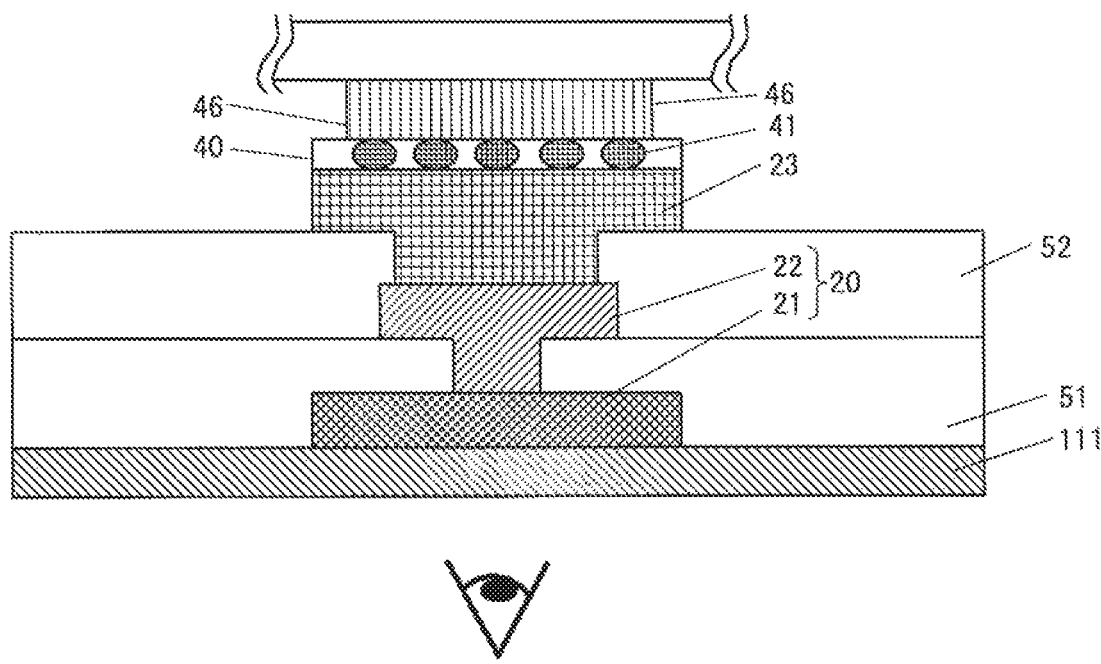
FIG. 16 is a cross-sectional view illustrating the state of connection between a bump of a drive chip and a pad of the connection wiring shown in FIG. 14.

FIG. 16 is a cross-sectional view illustrating the state of connection between the bump 46 of the drive chip 45 and the pad 20. As shown in FIG. 16, the pad 20 is structured by sequentially stacking the first pad layer 21, the second pad layer 22, and the transparent electrode 23 on the liquid crystal panel 111. More specifically, formed on the liquid crystal panel 111 is the first pad layer 21 made of the first metal in the shape of a rectangle, which is covered by an insulating film 51 formed thereon. Formed on the insulating film 51 is the second pad layer 22 made of the second metal in the shape of a rectangle smaller than the first pad layer 21. The second pad layer 22 is covered by an insulating film 52 formed thereon, and further formed on the insulating film 52 is the transparent electrode 23 made of a transparent metal and equal in size to the first pad layer 21. The bump 46 of the drive chip 45 and the pad 20 are connected by conductive particles 41 included in an ACF 40 provided therebetween.

The first pad layer 21 and the second pad layer 22 are electrically connected through a contact hole provided in the insulating film 51. The second pad layer 22 and the transparent electrode 23 are electrically connected through a contact hole provided in the insulating film 52. Accordingly, the first pad layer 21, the second pad layer 22, and the transparent electrode 23 are electrically connected as the pad 20. Note that the reason why the transparent electrode 23 is formed on the second pad layer 22 is to protect the surface of the second pad layer 22 and thereby keep the second pad layer 22 from being corroded or oxidized.

Figure 17:
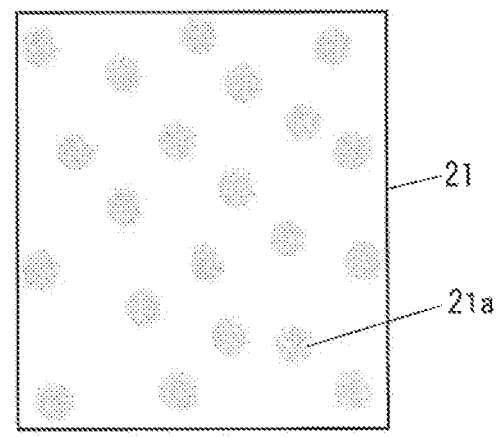
FIG. 17 is a diagram illustrating indentations in a first pad layer where the pad of the connection wiring shown in FIG. 14 is viewed through a liquid crystal panel under a microscope.

FIG. 17 is a diagram illustrating indentations 21a in the first pad layer 21 where the pad 20 of the connection wiring 87 is viewed through the liquid crystal panel 111 under a microscope. When the pad 20 is viewed from below under a microscope, the pad 20 can be seen through the liquid crystal panel 111 because the liquid crystal panel 111 is a transparent substrate such as a glass substrate. In this case, since the second pad layer 22 is covered by the first pad layer 21, only the first pad layer 21 can be seen, and the second pad layer 22 is not visible, as shown in FIG. 17. The number of indentations 21a in the first pad layer 21 caused by the conductive particles 41 as a result of heating and bonding the bump 46 and the pad 20 under pressure can be readily counted, and by the number of indentations 21a counted, the determination as to whether the state of connection between the pad 20 and the bump 46 is good or poor can be made.

It should be noted that examples of the first and second metals used in forming the connection wiring 87 include a copper layer (Cu), a stack film of a titanium layer (Ti) and a copper layer provided thereon, and a stack film of a copper layer or an aluminum layer (Al) provided between titanium layers. Moreover, such films are formed by sputtering or vapor deposition, preferably to a thickness of, for example, 100 to 300 nm.

2.3 Effects

In the present embodiment, the first and second lines 31 and 32 formed in different tiers are used and disposed such that in each intersecting area 35 between a pad row of a stage and a pad row of an adjacent stage, one first line 31 passes under an adjacent second line 32, or one second line 32 passes over an adjacent first line 31. In this case, of the three lines in any area between pads 20 in each stage, the line that is disposed in the middle is the first line 31, and the second lines 32 are disposed with the first line 31 situated therebetween. Accordingly, one first line 31 is disposed in each area between the wider first pad layers 21, and two second lines 32 are disposed in each area between the narrower second pad layers 22. Thus, the pitch between the pads 20 can be reduced without decreasing the width of the pads 20. Moreover, since there is no need to decrease the width of the pads 20, the margin for aligning the pads 20 with the bumps 46, which serve output terminals of the drive chip 45, remains the same as conventional, with the result that connection defects become less likely to occur between the bumps 46 and the pads 20.

Furthermore, the connection wiring 87 is formed on the liquid crystal panel 111, and therefore, when the pad 20 is viewed through the liquid crystal panel 111 under a microscope, only the first pad layer 21 can be seen. Accordingly, the indentations 21a in the first pad layer 21, which are caused by the conductive particles 41 in the ACF 40 being pressed, is readily visible and therefore can be readily counted. Thus, by the number of indentations 21a counted, the determination as to whether the state of connection is good or poor can be readily made.

3. Second Embodiment

The configuration of a liquid crystal display device with connection wiring according to the present embodiment formed therein is the same as the configuration of the liquid crystal display device 100 shown in FIG. 12, and therefore, any block diagram and description illustrating such will be omitted.

Figure 18:
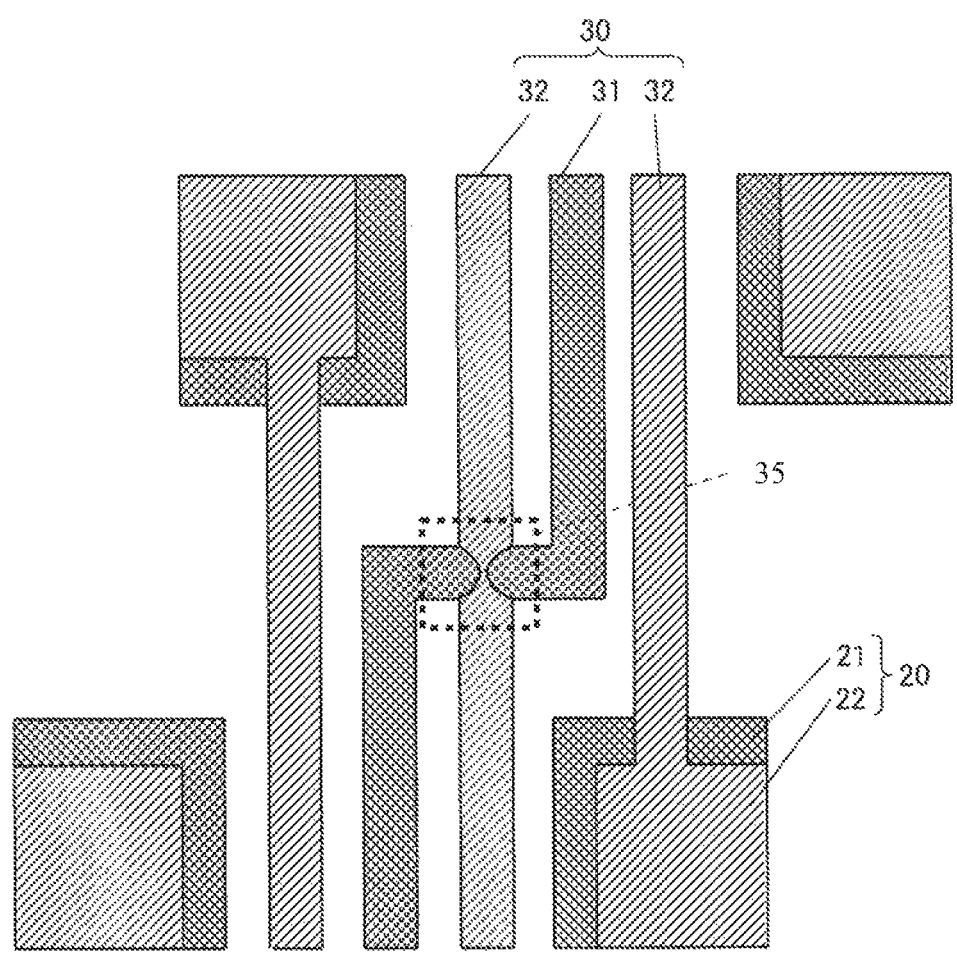
FIG. 18 is a plan view showing in enlargement an area between first and second stages of the connection wiring shown in FIG. 14.

In the connection wiring according to the present embodiment, the arrangement of the pads 20 and the lines 30 is the same as in the connection wiring 87 shown in FIG. 13, and therefore, any diagram and description illustrating such will be omitted. FIG. 18 is a plan view showing in enlargement the area between the first and second stages in FIG. 14. As shown in FIG. 18, the first line 31 passes leftward under the second line 32 adjacently positioned to the left. The second line 32 passes over the first line 31 and extends straight in the top-bottom direction in FIG. 18. In this case, when the second line 32 is formed by etching, the second line 32 tends to be narrowed or broken in the intersecting area 35 due to some level difference caused by the thickness of the first line 31. This results in a reduced yield of the connection wiring.

Figure 19:
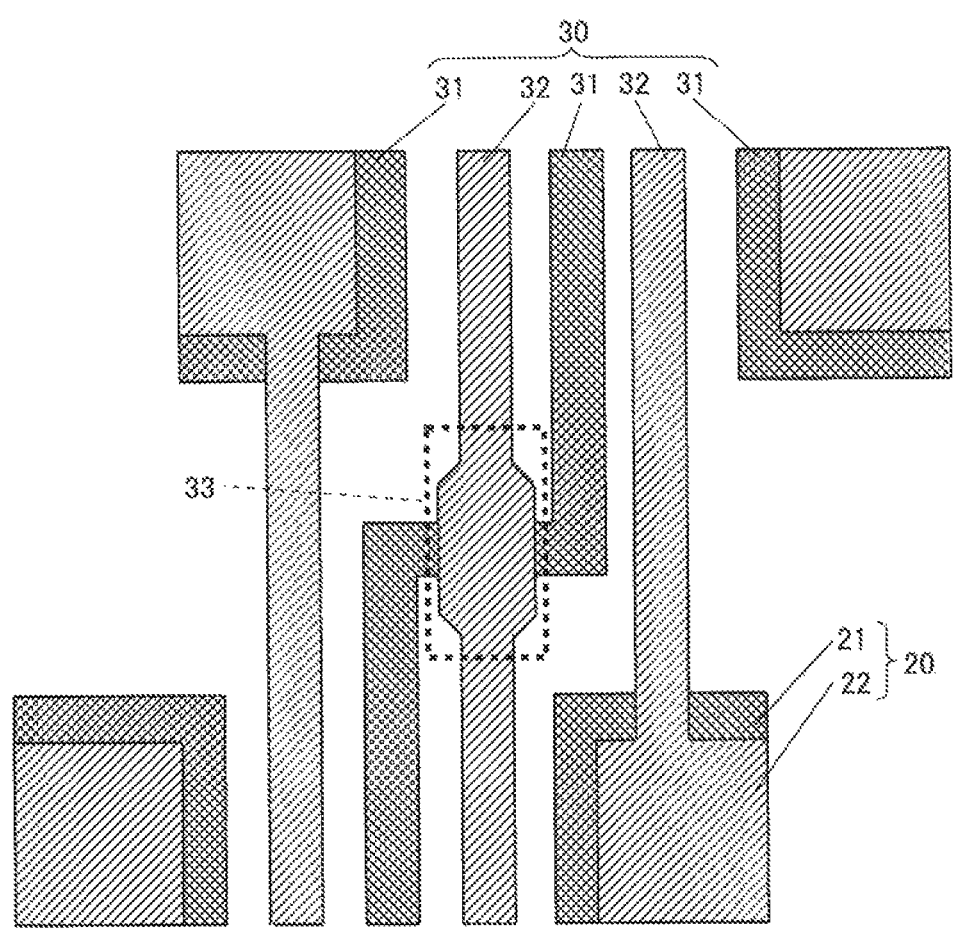
FIG. 19 is a cross-sectional view illustrating the shape of a second line at an intersecting portion of connection wiring in a second embodiment.

FIG. 19 is a cross-sectional view illustrating the shape of the second line over an elevated portion 33. As shown in FIG. 19, the second line 32 is widened over the elevated portion 33 in order to keep the second line 32 passing over the first line 31 from being narrowed or broken due to the level difference caused by the first line 31. For example, in the case where the width of the second line 32 is designed to be 3 to 4 μm, the width in the intersecting area 35 is designed to be 6 to 10 μm. Thus, even in the worst-case scenario, the width of the second line 32 over the elevated portion 33 after etching can be approximately 3 to 4 μm, which is the same as the width in portions without any level difference.

3.1 Effects

In the present embodiment, the second line 32 is widened over the elevated portion 33, where the second line 32 passes over the first line 31, with the result that the second line 32 can be prevented from being constricted or broken due to some level difference caused by the first line 31. Thus, even when the pitch between the pads 20 is further reduced, it is possible to reliably provide the scanning signal lines $G_1$ to $G_m$ and the data signal lines $S_1$ to $S_n$ with signals and signal voltages generated by the drive chip 45.

4. Third Embodiment

The configuration of a liquid crystal display device with connection wiring 88 according to the present embodiment formed therein is the same as the configuration of the liquid crystal display device 100 shown in FIG. 12, and therefore, any block diagram and description illustrating such will be omitted.

Figure 20:
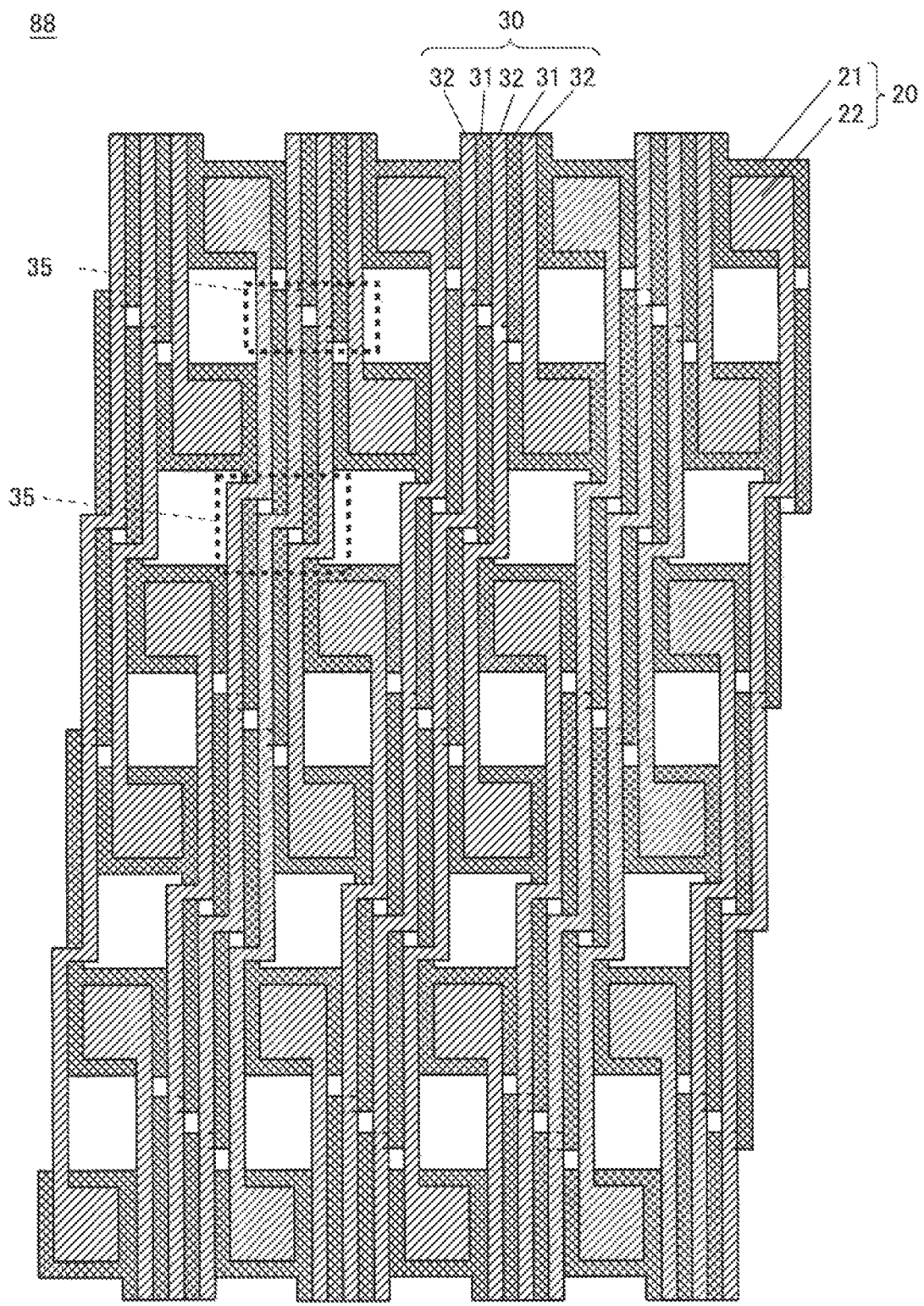
FIG. 20 is a plan view illustrating a part of connection wiring according to a third embodiment, including pads disposed in a six-stage staggered arrangement, along with lines.
Figure 21:
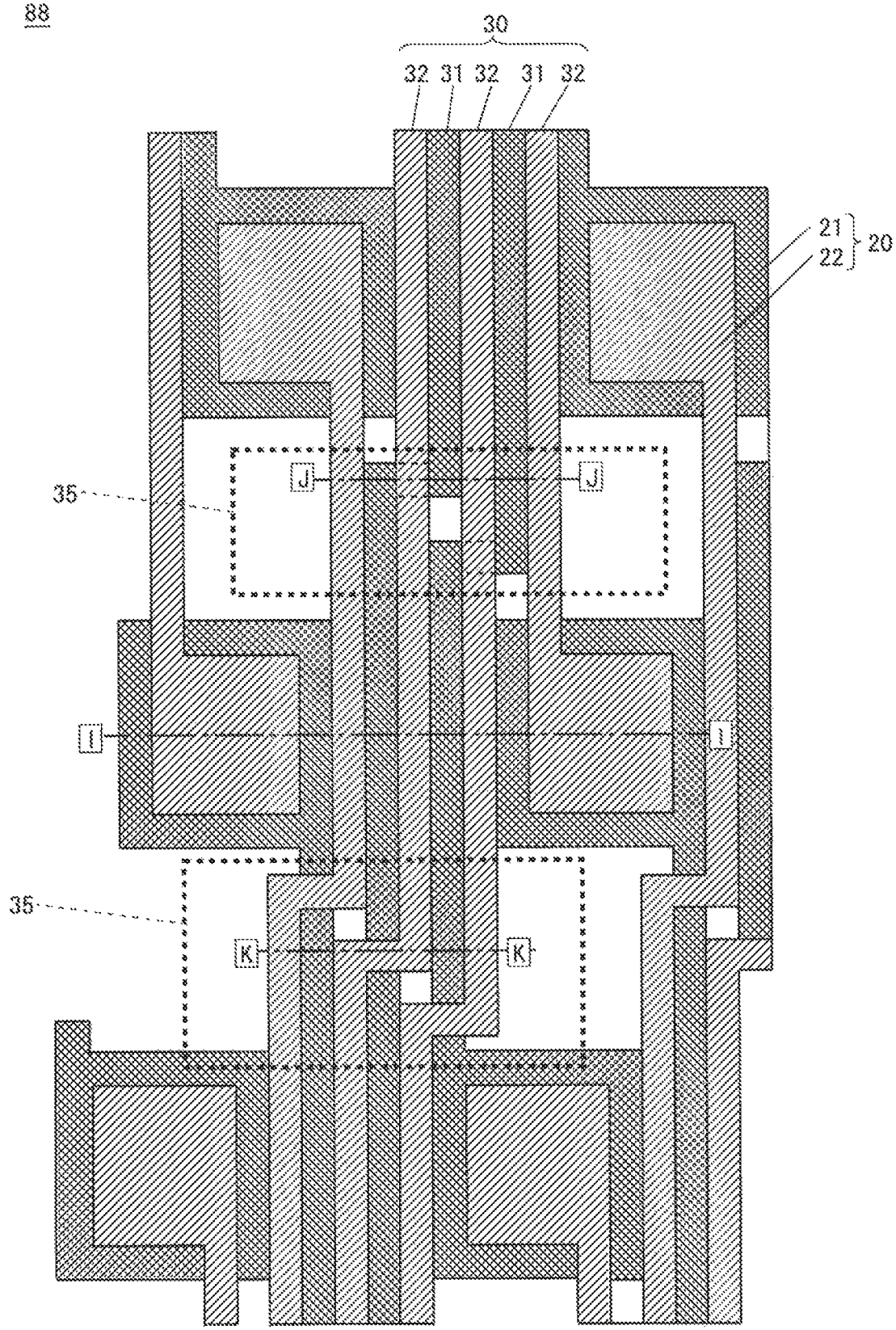
FIG. 21 is a plan view showing in enlargement a part of the connection wiring shown in FIG. 20.

FIG. 20 is a plan view illustrating a part of the connection wiring 88 according to the present embodiment, including pads 20 disposed in a six-stage staggered arrangement, along with lines 30, and FIG. 21 is a plan view showing in enlargement a part of the connection wiring 88 shown in FIG. 20. The lines 30 that extend to the top of FIG. 21 are connected to the scanning signal lines $G_1$ to $G_n$ or the data signal lines $S_1$ to $S_m$ formed on the liquid crystal panel 111, whereby control signals and signal voltages provided to the pads 20 through bumps of a drive chip are respectively applied to the scanning signal lines $G_1$ to $G_n$ and the data signal lines $S_1$ to $S_m$. On the other hand, the lines 30 that extend to the bottom of FIG. 21 are connected to a test circuit (not shown) for testing the operation of pixel circuits $P_{ij}$, whereby test control signals and test signal voltages provided by the test circuit are respectively applied to the scanning signal lines $G_1$ to $G_n$ and the data signal lines $S_1$ to $S_m$. Note that the connection wiring 88 shown in FIG. 20 is a part of the connection wiring formed on the liquid crystal panel 111 and, in actuality, extends leftward and rightward beyond FIG. 20.

Figure 22:
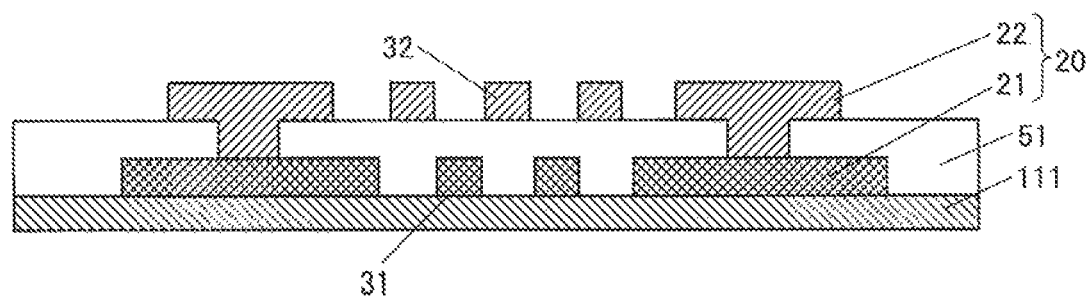
FIG. 22 provides cross-sectional views illustrating in cross section the connection wiring shown in FIG. 21; more specifically, part (A) is a cross-sectional view of the connection wiring shown in FIG. 21, taken along line I-I, part (B) is a cross-sectional view of an intersecting portion of the connection wiring shown in FIG. 21, taken along line J-J, and part (C) is a cross-sectional view of another intersecting portion of the connection wiring shown in FIG. 21, taken along line K-K.
Figure 22:
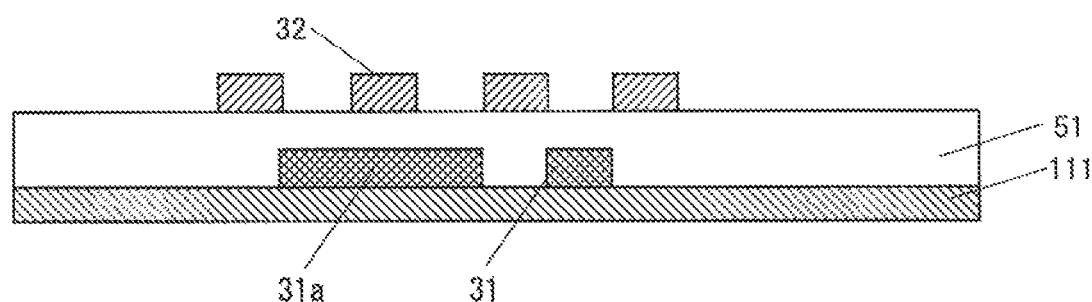
Figure 22:
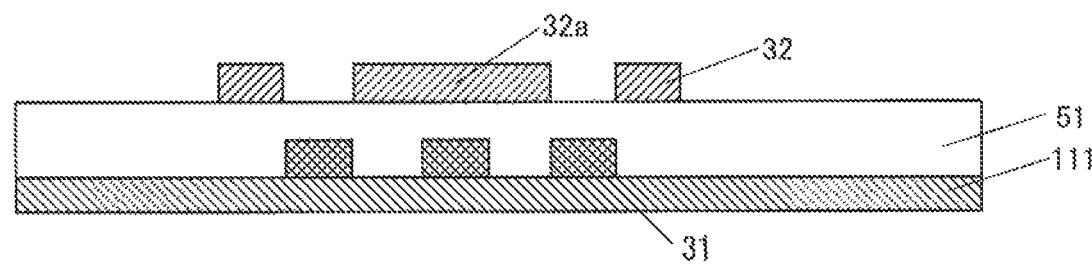

FIG. 22 provides cross-sectional views illustrating in cross section the connection wiring 88 shown in FIG. 21; more specifically, FIG. 22(A) is a cross-sectional view of the connection wiring 88 shown in FIG. 21, taken along line I-I, FIG. 22(B) is a cross-sectional view of an intersecting area 35 of the connection wiring 88 shown in FIG. 21, taken along line J-J, and FIG. 22(C) is a cross-sectional view of another intersecting area 35 of the connection wiring 88 shown in FIG. 21, taken along line K-K.

As shown in FIGS. 20 and 21, the pads 20 are disposed in a six-stage staggered arrangement, and as in the first embodiment, each pad 20 in the stages includes a stack of the first pad layer 21, the second pad layer 22, and the transparent electrode 23, with the first pad layer 21 being formed larger than the second pad layer 22. Moreover, unlike in the first embodiment, each area between the pads 20 in each stage includes a total of five lines, two of which are first lines 31 made of the first metal and three of which are second lines 32 made of the second metal.

The width W1 of the first pad layer 21 is larger than the width W2 of the second pad layer 22, and therefore, the width of the area between the first pad layers 21 is smaller than the area between the second pad layers 22. Therefore, of the five lines that are disposed in the area between the pads 20, the two first lines 31 formed of the first metal are disposed in the same tier as the first pad layer 21, and the three second lines 32 formed of the second metal are disposed in the same tier as the second pad layer 22. Thus, even when the space between the first pad layer 21 and the first line 31 and the space between the second pad layer 22 and the second line 32 are narrowed by the same amount, the first pad layer 21 and the first line 31 become less likely to suffer from a short circuit caused by contacting each other, and the second pad layer 22 and the second line 32 also become less likely to suffer from a short circuit caused by contacting each other.

Therefore, the five lines are disposed such that the two first lines 31 are situated between respective pairs from among the three second lines 32 when viewed from above. In this case, the first lines 31 and the second lines 32 are disposed in each area between the pads 20 in the stages.

In each intersecting area 35 between pad rows of the first and second stages, first lines 31a are provided so as to extend laterally, such that two first lines 31 continue leftward and respectively pass under two second lines 32 adjacently positioned to the left, so as to be positioned between respective pairs of second lines 32. As a result, in each area between the pads 20 in the second stage also, two first lines 31 and three second lines 32 are disposed with the two first lines 31 situated between respective pairs from among the three second lines 32.

In each intersecting area 35 between pad rows of the second and third stages, second lines 32a are provided so as to extend laterally, such that two second lines 32 continue leftward and respectively pass over two first lines 31 adjacently positioned to the left, so as to be positioned between respective pairs of first lines 31. As a result, in each area between the pads 20 in the third stage also, two first lines 31 and three second lines 32 are disposed with the two first lines 31 situated between respective pairs from among the three second lines 32.

In each intersecting area 35 between pad rows of the third and fourth stages and between pad rows of the fifth and sixth stages, as in the intersecting areas 35 between the pad rows of the first and second stages, two first lines 31 respectively pass below two second lines 32 adjacently positioned to the left. As a result, in each area between the pads 20 in the fourth and sixth stages also, two first lines 31 and three second lines 32 are disposed with the two first lines 31 situated between respective pairs of second lines 32.

In each intersecting area 35 between pad rows of the fourth and fifth stages, as in the intersecting areas 35 between the pad rows of the second and third stages, three second lines 32 respectively pass over two first lines 31 adjacently positioned to the left. As a result, in each area between the pads 20 in the fifth stage also, two first lines 31 and three second lines 32 are disposed with the two first lines 31 situated between respective pairs of second lines 32.

In this manner, in the case of the six-stage staggered arrangement, five lines are disposed in each area between the pads 20, such that three second lines 32 are positioned between the wider second pad layers 22, and two first lines 31 are positioned between the narrower first pad layers 21, whereby it is rendered possible to reduce the pitch between the pads 20 without reducing the width of the pads 20. Thus, in the case of the six-stage staggered arrangement, as in the case of the four-stage staggered arrangement, connection defects become less likely to occur between the pads 20 and the bumps 46.

It should be noted that in the present embodiment also, the second line 32 is widened over an elevated portion, with the result that the second line 32 can be prevented from being constricted or broken due to some level difference caused by the first line 31.

4.1 Effects

In the present embodiment, as in the first embodiment, the pitch between the pads 20 can be reduced for all stages without changing the width of the pads 20. As a result, the spaces between the pads 20 in each stage can be set narrower than in the conventional art. Thus, the pitch between the pads 20 can be reduced without decreasing the width of the pads 20. Moreover, since there is no need to decrease the width of the pads 20, the margin for aligning the pads 20 with the bumps 46, which serve as output terminals of the drive chip 45, can be set to the same size as is conventionally set. Thus, connection defects become less likely to occur between the bumps 46 and the pads 20.

Furthermore, as in the first embodiment, when the pad 20 is viewed through the liquid crystal panel 111 under a microscope, only the first pad layer 21 can be seen, and therefore, indentations 21a in the first pad layer 21 is readily visible. Thus, the number of indentations 21a can be readily counted, and by the number of indentations 21a counted, the determination as to whether connection quality is good or poor can be readily made.

5. Other

While the connection wiring 87 and 88 according to the embodiments have been described as being used in liquid crystal display devices, the connection wiring can also be used in, for example, organic EL display devices. Moreover, the use is not limited to display devices and can also extend to electronic devices including mounted bare chips with bumps.

Furthermore, the embodiments have been described with respect to the connection wiring with the pads being disposed in the four-stage or six-stage staggered arrangement, but the present invention can also be applied to connection wiring with pads provided in a seven-or-more-stage staggered arrangement with a view to reducing the pitch between the pads 20 without decreasing the width of the pads 20.

This application claims priority to Japanese Patent Application No. 2016-234045, filed Dec. 1, 2016 and titled "CONNECTION WIRING", the content of which is incorporated by reference herein.

DESCRIPTION OF THE REFERENCE CHARACTERS 20 pad
21 first pad layer
21a indentation
22 second pad layer
30 line
31 first line
32 second line
35 intersecting area
40 anisotropic conductive film (ACF)
41 conductive particle
45 drive chip (semiconductor chip)
46 bump
100 liquid crystal display device (display device)
111 liquid crystal panel (transparent substrate)
113 scanning signal line driver circuit
114 data signal line driver circuit

The invention claimed is:
1. A connection wiring comprising:
a plurality of pads disposed in a multi-stage staggered arrangement with four or more stages; and
a plurality of lines respectively extending from the pads, wherein, the pads include first pad layers formed on a substrate and second pad layers stacked on top of the first pad layers and smaller than the first pad layers, the lines include first lines formed in the same tier as the first pad layers and extending from the first pad layers and second lines formed in the same tier as the second pad layers and extending from the second pad layers, in an area between the pads arranged in the same stage, at least one of the first lines and at least two of the second lines are disposed parallel to one another such that two of the second lines are situated on opposite sides of one of the first lines so as to have the first line positioned therebetween, and in an intersecting area between pad rows of adjacent stages, a first type of either the first or second lines crosses a second type of line adjacent to a first type above or below a second type so as to be positioned between a different pair of a second another-type of lines and extend toward an area between the pads in a pad row in a subsequent stage.

2. The connection wiring according to claim 1, wherein, in the intersecting area where the lines that extend from the pads in the pad row in are the second lines, the first line is formed so as to cross an adjacent second line below the adjacent second line from a point of being positioned between a pair of second lines to a point of being positioned between a different pair of second lines, and in the intersecting area where the lines that extend from the pads in the pad row are the first lines, the pair of the second lines with the first line positioned therebetween is disposed so as to respectively cross first lines adjacent to the pair of the second lines above the adjacent first lines and have a different first line positioned therebetween.

3. The connection wiring according to claim 2, wherein, the pads are disposed in a four-stage staggered arrangement, the lines that are disposed in the area between the pads in the same stage consist of one first line and two second lines disposed with the first line positioned therebetween, in the intersecting areas where the lines that extend from the pads in the pad row are the second lines, the first line is formed so as to cross an adjacent second line below the adjacent second line to a point of being positioned between a different pair of second lines, and in the intersecting area where the lines that extend from the pads in the pad row are the first lines, the pair of the second lines with the first line positioned therebetween is disposed so as to respectively cross first lines adjacent to the pair of the second lines above the adjacent first lines and have a different first line positioned therebetween.

4. The connection wiring according to claim 3, wherein, in the intersecting area where the lines that extend from the pads in the pad row are the second lines, the second lines are formed so as to become wider in an intersection where the second lines cross the first line above the first line.

5. The connection wiring according to claim 2, wherein, the pads are disposed in a six-stage staggered arrangement, the lines that are disposed in the area between the pads arranged in the same stage consist of two first lines and three second lines with the two first lines positioned between respective pairs from among the three second lines, in the intersecting area where the lines that extend from the pads in the pad row are the second lines, the two first lines are formed so as to respectively cross second lines adjacent to the two first lines below the adjacent second lines to a point of being respectively positioned between different pairs of second lines, and in the intersecting area where the lines that extend from the pads in the pad row are the first lines, the three second lines with the two first lines positioned between the respective pairs are disposed so as to respectively cross first lines adjacent to the three second lines above the adjacent first lines and make pairs in such a manner that each pair has a different first line positioned therebetween.

6. A display device comprising:

a display portion having a plurality of data signal lines, a plurality of scanning signal lines crossing the data signal lines, and a plurality of pixel circuits respectively disposed near intersections of the data signal lines and the scanning signal lines;

a semiconductor chip with a driver circuit formed for driving the pixel circuits; and connection wiring of claim 1, wherein, the semiconductor chip is mounted on the connection wiring by a plurality of bumps formed on a surface of the semiconductor chip being bonded under pressure to the respective pads of the connection wiring by means of an anisotropic conductive film, and the pads of the connection wiring have lines extending therefrom and connected at the a first end to the data signal lines or the scanning signal lines.

7. The display device according to claim 6, wherein the lines that respectively extend from the pads of the connection wiring are connected at a second end to a test circuit.

8. The display device according to claim 6, wherein the substrate with the first pad layers formed thereon is a transparent substrate.

* * * * *